(12) United States Patent
Nitta et al.

(10) Patent No.: US 7,195,024 B2
(45) Date of Patent: *Mar. 27, 2007

(54) CHEMICAL SUPPLY SYSTEM

(75) Inventors: Takahisa Nitta, Tokyo (JP); Nobuhiro Miki, Tokyo (JP); Yoshiaki Yamaguchi, Tokyo (JP)

(73) Assignee: SIPEC Corporation, Tokyo (JP)

( * ) Notice: Subject to any disclaimer, the term of this patent is extended or adjusted under 35 U.S.C. 154(b) by 97 days.

This patent is subject to a terminal disclaimer.

(21) Appl. No.: 10/849,836

(22) Filed: May 21, 2004

(65) Prior Publication Data

US 2005/0045207 A1  Mar. 3, 2005

Related U.S. Application Data

(62) Division of application No. 09/436,637, filed on Nov. 9, 1999, now Pat. No. 6,764,212.

(30) Foreign Application Priority Data

| Nov. 10, 1998 | (JP) | ................................. 10-319035 |
| Jan. 13, 1999 | (JP) | .................................... 11-7063 |
| Nov. 8, 1999 | (JP) | .................................. 11-316244 |

(51) Int. Cl.
*B08B 3/08* (2006.01)

(52) U.S. Cl. .................... 134/95.1; 134/100.1

(58) Field of Classification Search ............... 134/95.1, 134/94.1, 95.3, 99.1, 99.2, 100.1

See application file for complete search history.

(56) References Cited

U.S. PATENT DOCUMENTS

| 4,133,773 | A | * | 1/1979 | Simmons ...................... 261/21 |
| 4,254,805 | A | * | 3/1981 | Reeder ......................... 141/59 |
| 4,664,528 | A | * | 5/1987 | Rodgers et al. ............. 366/142 |
| 4,964,732 | A | * | 10/1990 | Cadeo et al. ............. 366/152.1 |
| 5,873,946 | A | * | 2/1999 | Hantmann .................... 134/15 |
| 6,132,078 | A | | 10/2000 | Lin |
| 6,764,212 | B1 | * | 7/2004 | Nitta et al. .................. 366/114 |

* cited by examiner

*Primary Examiner*—Michael Barr
*Assistant Examiner*—Saeed Chaudhry
(74) *Attorney, Agent, or Firm*—Connolly Bove Lodge & Hutz LLP

(57) ABSTRACT

A chemical supply system comprises, as principal elements, a chemical storage tank in which a liquid chemical for cleaning is stored in the state of its formulated concentrate, a chemical supply apparatus connected to the chemical storage tank for positively performing chemical supply, a piping system connected to the chemical supply apparatus to form a supply flow passage that is a passage for ultrapure water which the liquid chemical is to be mixed with, a pair of discharge nozzles disposed at end portions of the piping system so as to oppose surfaces of a wafer set in a cleaning chamber to supply a cleaning liquid onto the surfaces. Thereby, remarkable miniaturization/simplification of a cleaning liquid supply system including chemical tanks is intended, it is made possible easily and rapidly to compound and supply a cleaning liquid at an accurate chemical concentration, and particles or the like being generated and mixing in a cleaning liquid, are suppressed to the extremity.

1 Claim, 33 Drawing Sheets

44 51

44

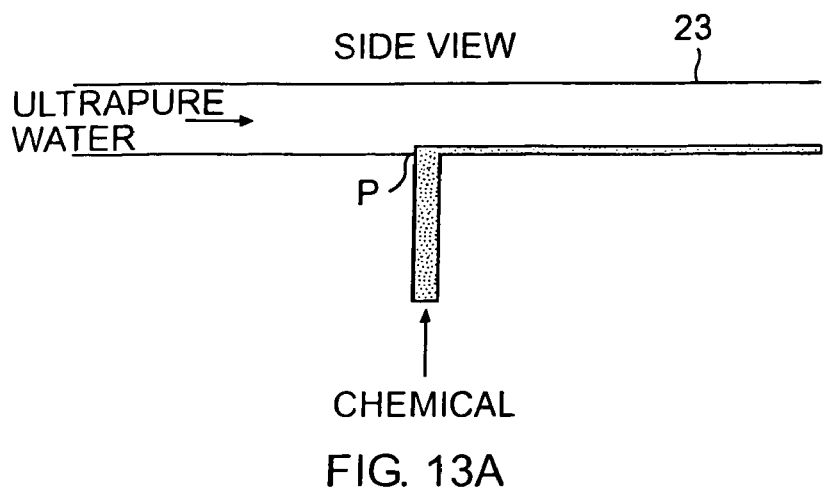
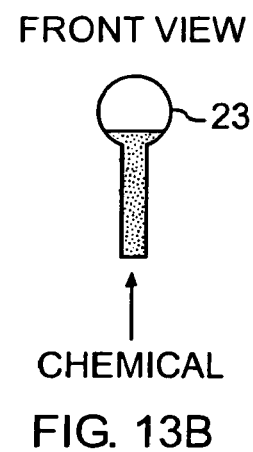
FIG. 13A     FIG. 13B
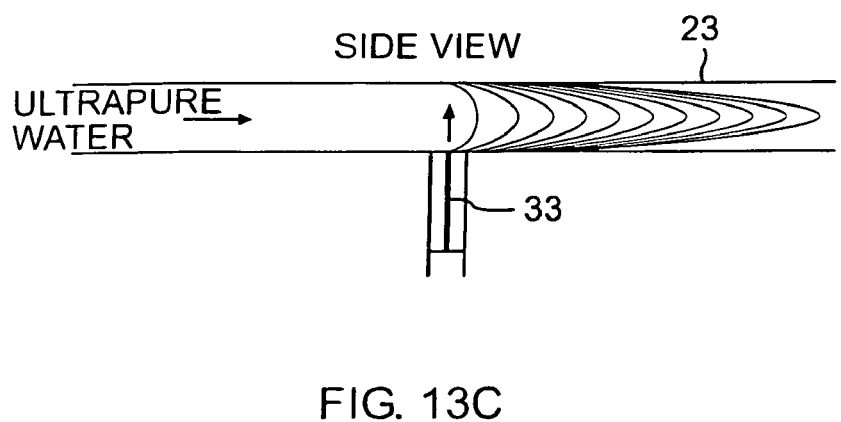
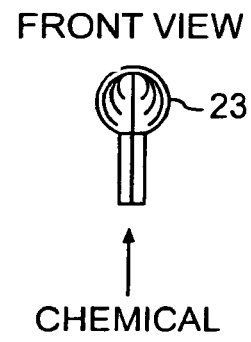
FIG. 13C     FIG. 13D
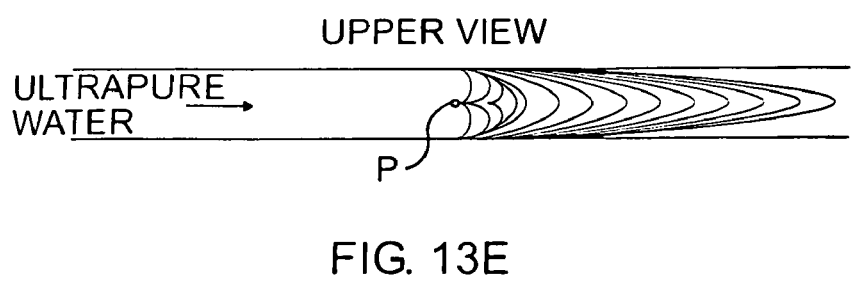
FIG. 13E

CHEMICAL SUPPLY SYSTEM

This application is a Divisional Application of Ser. No. 09/436,637, filed Nov. 9, 1999 now U.S. Pat. No. 6,764,212.

BACKGROUND OF THE INVENTION

1. Field of the Invention

The present invention relates to a chemical supply pump, a chemical supply apparatus, and a chemical supply system (a chemical supply method) for accurately supplying a desired quantity of a liquid chemical, in particular, it is suitable for applying to a substrate cleaning apparatus (a substrate cleaning method) for cleaning semiconductor wafers or the like.

2. Description of the Related Art

Conventionally in a semiconductor wet process, used is a substrate cleaning apparatus for performing a process such as cleaning with a cleaning liquid of ultrapure water and a liquid chemical. As such a substrate cleaning apparatus, remarked is a substrate single wafer spin cleaning apparatus in which substrates are loaded one by one and a cleaning liquid is supplied with rotating the substrate in a circumferential direction.

In a conventional substrate cleaning apparatus, it was indispensable to provide a plurality of large-sized cleaning liquid storage tanks for preparing various liquid chemicals at desired concentrations necessary for cleaning. Accordingly, the whole system becomes a very large scale and complex inevitably in this case.

Besides, due to the necessity of providing a plurality of cleaning liquid storage tanks according to the necessary kinds of cleaning liquids as described above, particles are easy to mix in when a cleaning liquid is compounded. Further, generation of particles and (metal) contamination from various liquid-contact portion caused by complication of the substrate cleaning apparatus is in question.

In this manner, at present, it is difficult to avoid increases in scale and complication of the whole apparatus attendant upon an increase in cleaning speed of substrate cleaning apparatus. It is the present state that establishment of a technique of preventing particle-mixing or the like in a cleaning liquid, is eagerly desired.

SUMMARY OF THE INVENTION

It is an object of the present invention to provide a chemical supply pump, a chemical supply apparatus, a chemical supply system, a substrate cleaning apparatus, a chemical supply method, and a substrate cleaning method, wherein remarkable miniaturization/simplification of a cleaning liquid supply system including chemical reservoirs (chemical storage tanks) is intended, it becomes possible easily and rapidly to compound and supply a cleaning liquid at an accurate chemical concentration when it is required in cleaning, and it is realized to suppress particles or the like being generated and mixing in a cleaning liquid, to the extremity.

In order to attain the above object, a chemical supply pump of the present invention is a chemical supply pump in which a flow passage for passing a predetermined liquid chemical is formed, a suction valve which is closed by pressure rise of said liquid chemical is provided at a flowing-in port of said flow passage, and a discharge valve which is closed by pressure fall of said liquid chemical is provided at a flowing-out port of said flow passage, wherein at least part of a liquid contact surface in said flow passage is made of a compact member with non-permeability and a high anti-corrosion property to said liquid chemical, and part of said compact member is made into a movable wall, and a shaker connected to said movable wall is provided, and said movable wall is oscillated in a direction substantially perpendicular to its wall surface by drive of said shaker to change the volume of said flow passage periodically.

A chemical supply apparatus of the present invention comprises a chemical supply pump, and a connecting flow passage connecting a supply flow passage that is a passage for a solvent with which said liquid chemical is mixed, and said chemical supply pump, wherein a tubule member directly connecting said supply flow passage is provided in said connecting flow passage. In said chemical supply pump, a flow passage for passing a predetermined liquid chemical is formed, a suction valve which is closed by pressure rise of said liquid chemical is provided at a flowing-in port of said flow passage, and a discharge valve which is closed by pressure fall of said liquid chemical is provided at a flowing-out port of said flow passage, at least part of a liquid contact surface in said flow passage is made of a compact member with non-permeability and a high anti-corrosion property to said liquid chemical, and part of said compact member is made into a movable wall, and a shaker connected to said movable wall is provided, and said movable wall is oscillated in a direction substantially perpendicular to its wall surface by drive of said shaker to change the volume of said flow passage periodically. Said chemical supply apparatus discharges said liquid chemical from said tubule member into said solvent passing through said supply flow passage by drive of said chemical supply pump to compound a mixture solution at a desired concentration.

A chemical supply system of the present invention is a chemical supply system comprising at least one kind of chemical reservoir easy to move, a chemical supply apparatus connected in correspondence to said chemical reservoir, and said supply flow passage. Said chemical supply apparatus comprises a chemical supply pump, and a connecting flow passage connecting the supply flow passage that is a passage for a solvent with which said liquid chemical is mixed, and said chemical supply pump, wherein a tubule member directly connected to said supply flow passage is provided in said connecting flow passage. In said chemical supply pump, a flow passage for passing a predetermined liquid chemical is formed, a suction valve which is closed by pressure rise of said liquid chemical is provided at a flowing-in port of said flow passage, and a discharge valve which is closed by pressure fall of said liquid chemical is provided at a flowing-out port of said flow passage, at least part of a liquid contact surface in said flow passage is made of a compact member with non-permeability and a high anti-corrosion property to said liquid chemical, and part of said compact member is made into a movable wall, and a shaker connected to said movable wall is provided, and said movable wall is oscillated in a direction substantially perpendicular to its wall surface by drive of said shaker to change the volume of said flow passage periodically. Said chemical supply apparatus discharges said liquid chemical from said tubule member into said solvent passing through said supply flow passage by drive of said chemical supply pump to compound a mixture solution at a desired concentration. Said chemical supply system discharges said mixture solution made into the predetermined concentration from a discharge portion provided at an end portion of said supply flow passage, by drive of said chemical supply pump of said chemical supply apparatus.

A substrate cleaning apparatus of the present invention is a substrate cleaning apparatus in which a cleaning liquid is supplied to a set substrate to clean, and comprises a chemical supply system. Said chemical supply system comprises at least one kind of chemical reservoir easy to move, a chemical supply apparatus connected in correspondence to said chemical reservoir, and a supply flow passage. Said chemical supply apparatus discharges said liquid chemical from said tubule member into said solvent passing through said supply flow passage by drive of said chemical supply pump to compound a mixture solution at a desired concentration, and comprises a chemical supply pump, and a connecting flow passage connecting the supply flow passage that is a passage for a solvent with which said liquid chemical is mixed, and said chemical supply pump, wherein a tubule member directly connected to said supply flow passage is provided in said connecting flow passage. In said chemical supply pump, a flow passage for passing a predetermined liquid chemical is formed, a suction valve which is closed by pressure rise of said liquid chemical is provided at a flowing-in port of said flow passage, and a discharge valve which is closed by pressure fall of said liquid chemical is provided at a flowing-out port of said flow passage, at least part of a liquid contact surface in said flow passage is made of a compact member with non-permeability and a high anti-corrosion property to said liquid chemical, and part of said compact member is made into a movable wall, and a shaker connected to said movable wall is provided, and said movable wall is oscillated in a direction substantially perpendicular to its wall surface by drive of said shaker to change the volume of said flow passage periodically. Said substrate cleaning apparatus uses said mixture solution as said cleaning liquid.

A chemical supply method of the present invention is a chemical supply method using a chemical supply pump, wherein, in said chemical supply pump, a flow passage for passing a predetermined liquid chemical is formed, a suction valve which is closed by pressure rise of said liquid chemical is provided at a flowing-in port of said flow passage, and a discharge valve which is closed by pressure fall of said liquid chemical is provided at a flowing-out port of said flow passage, at least part of a liquid contact surface in said flow passage is made of a compact member with non-permeability and a high anti-corrosion property to said liquid chemical, and part of said compact member is made into a movable wall, and a shaker connected to said movable wall is provided, and said movable wall is oscillated in a direction substantially perpendicular to its wall surface by drive of said shaker to change the volume of said flow passage periodically, and said chemical supply pump is driven, and said liquid chemical is discharged into a solvent passing through said supply flow passage to compound a mixture solution at a desired concentration.

A substrate cleaning method of the present invention is a substrate cleaning method in which a cleaning liquid is supplied to a set substrate to clean, wherein a chemical supply pump is used in which a flow passage for passing a predetermined liquid chemical is formed, a suction valve which is closed by pressure rise of said liquid chemical is provided at a flowing-in port of said flow passage, and a discharge valve which is closed by pressure fall of said liquid chemical is provided at a flowing-out port of said flow passage, at least part of a liquid contact surface in said flow passage is made of a compact member with non-permeability and a high anti-corrosion property to said liquid chemical, and part of said compact member is made into a movable wall, and a shaker connected to said movable wall is provided, and said movable wall is oscillated in a direction substantially perpendicular to its wall surface by drive of said shaker to change the volume of said flow passage periodically, and said chemical supply pump is driven, said liquid chemical is discharged into a solvent passing through said supply flow passage, a mixture solution at a desired concentration is compounded, and said mixture solution is used as said cleaning liquid to clean said substrate surface.

A chemical supply system of the present invention is a chemical supply system for supplying a mixture solution in which a liquid chemical is mixed and diluted with a solvent, comprising at least one kind of chemical reservoir easy to move, in which said liquid chemical at a high concentration is stored, a chemical supply means for sucking a predetermined quantity of said liquid chemical from said chemical reservoir and feeding out it, and a piping system forming a flow passage for said solvent connected to said chemical supply means, and having a discharge portion for said solution at an end portion, wherein, at the time of use, a necessary quantity of said liquid chemical is mixed with said solution flowing in said piping system, said mixture solution at a desired concentration is produced, and said mixture solution is supplied from said discharge portion.

According to a chemical supply pump of the present invention, a movable wall is driven and controlled by a shaker to oscillate, and a liquid chemical is discharged by the pressure, and a desired quantity of the liquid chemical can be discharged and supplied with accuracy. Here, used is a compact member, preferably, amorphous carbon, that at least part of the liquid contact surface has non-permeability and a high anti-corrosion property to the liquid chemical. This amorphous carbon is a material easy to control its porosity, and one whose porosity is substantially zero is very superior in non-permeability and the high anti-corrosion property. Accordingly, by providing this amorphous carbon on the important portion of the liquid contact surface, the supply quantity control of the liquid chemical becomes more accurate, and mixing of particles or the like into the liquid chemical is suppressed.

Further in the present invention, provided is a chemical supply apparatus including this chemical supply pump as a component. This chemical supply apparatus mixes a liquid chemical from a tubule member with a solvent whose representative is ultrapure water passing through a supply flow passage by drive of the chemical supply pump, and mixture solutions at various concentrations can easily be compounded at need. Here, in case that the discharge direction of the liquid chemical is a direction substantially perpendicular to the flow direction of the above solvent, by applying a pressure to the liquid chemical such that the linear velocity of the liquid chemical discharged from the tubule member is sufficiently greater than the linear velocity of the solvent passing through the supply flow passage, the liquid chemical reaches the opposite wall surface of the supply flow passage in the solvent, and a mixture solution at a uniform concentration is compounded in a moment.

Further in the present invention, provided is a chemical supply system including this chemical supply apparatus as a component and for supplying the above mixture solution. In this chemical supply system, because it is possible to produce mixture solutions at desired concentrations at need as described above, enough is the easily movable small-sized reservoir for the liquid chemical that is the formulated concentrate. That is, in this chemical supply system, there is no necessity of providing very large reservoirs for mixture solutions different in chemical concentration and kind as conventionally, and not only particle mixing to a cleaning liquid, or the like, can be suppressed, but also remarkable reduction/simplification of the scale of the whole system can be realized. Accordingly, by applying this chemical supply system to, e.g., a substrate cleaning apparatus, it becomes possible rapidly and easily to supply various pure cleaning liquids (mixture solutions) different in concentration and kind.

Accordingly, according to the present invention, remarkable miniaturization/simplification of a cleaning liquid supply system including chemical reservoirs (chemical storage tanks) is intended, it becomes possible easily and rapidly to compound and supply a cleaning liquid at an accurate chemical concentration when it is required in cleaning, and it is realized to suppress particles or the like being generated and mixing in a cleaning liquid, to the extremity.

BRIEF DESCRIPTION OF THE DRAWINGS

FIGS. 13A through 13E are typical views showing chemical diffusion patterns at a mixing point of a liquid chemical and ultrapure water;

FIG. 15 is a typical view showing a concrete example of mixing prevention system for particles or the like;

FIG. 16 is a typical view showing another concrete example of mixing prevention system for particles or the like;

FIG. 17 is a typical view showing still another concrete example of mixing prevention system for particles or the like;

DETAILED DESCRIPTION OF THE PREFERRED EMBODIMENTS

Hereinafter, various concrete examples of substrate cleaning apparatus of the present invention will be described in detail with reference to drawings.

FIRST EXAMPLE

A substrate cleaning apparatus of this example is in which wafers are loaded one by one and a cleaning liquid is supplied with rotating the wafer in a circumferential direction, and a single wafer spin cleaning apparatus capable of realizing wide-ranging functions in a wet cleaning process for semiconductor wafers or the like.

Figure 1:
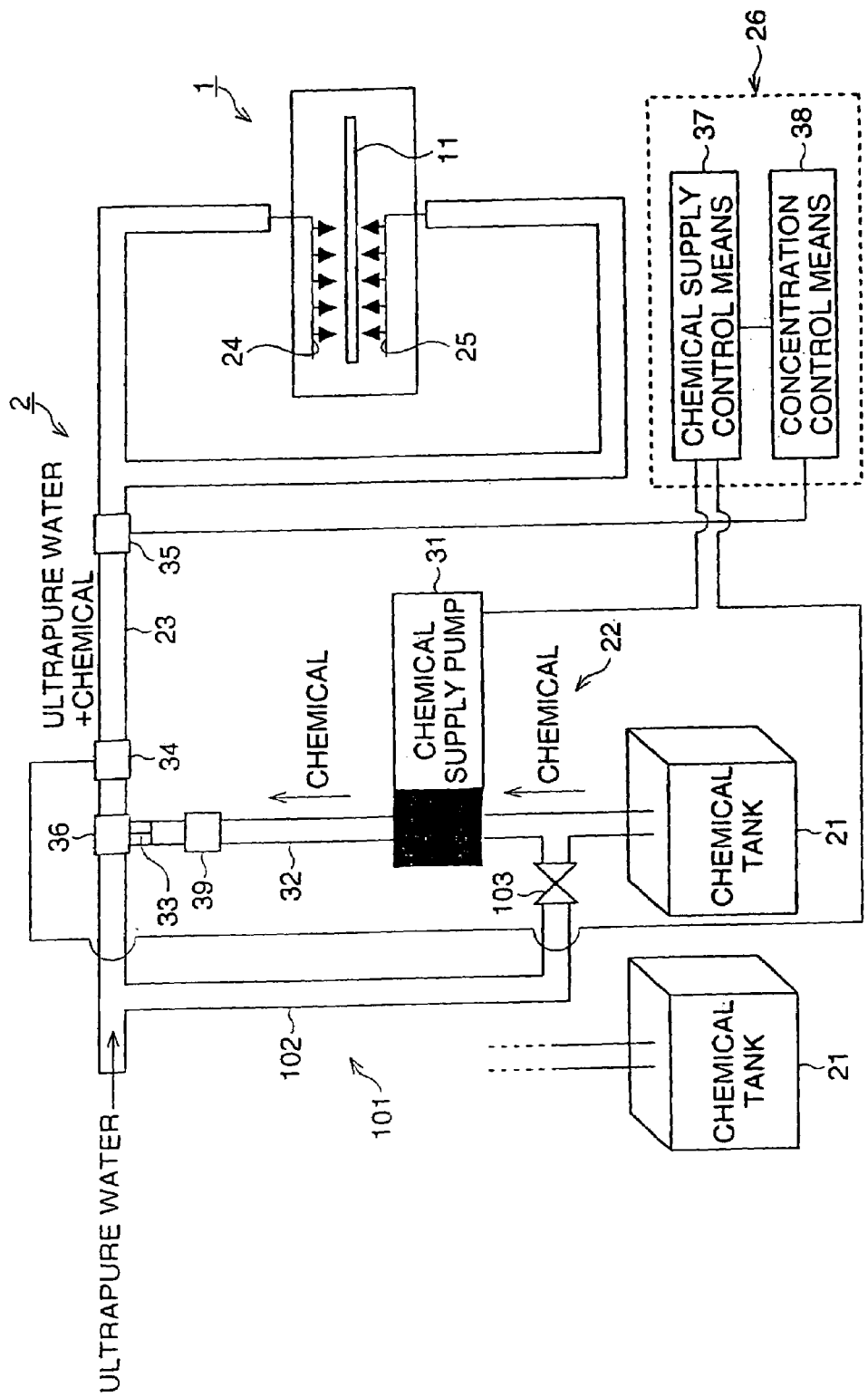
FIG. 1 is a typical view showing an example of wafer one-by-one (single wafer) spin cleaning apparatus including a chemical supply system according to the first example.

FIG. 1 is a schematic sectional view showing the whole construction of the substrate cleaning apparatus of this example.

This substrate cleaning apparatus is constructed by comprising a cleaning chamber 1 in which a substrate (wafer) 11 is set and cleaning is performed, and a chemical supply system 2 for producing and supplying a cleaning liquid at a desired chemical concentration.

Figure 2:
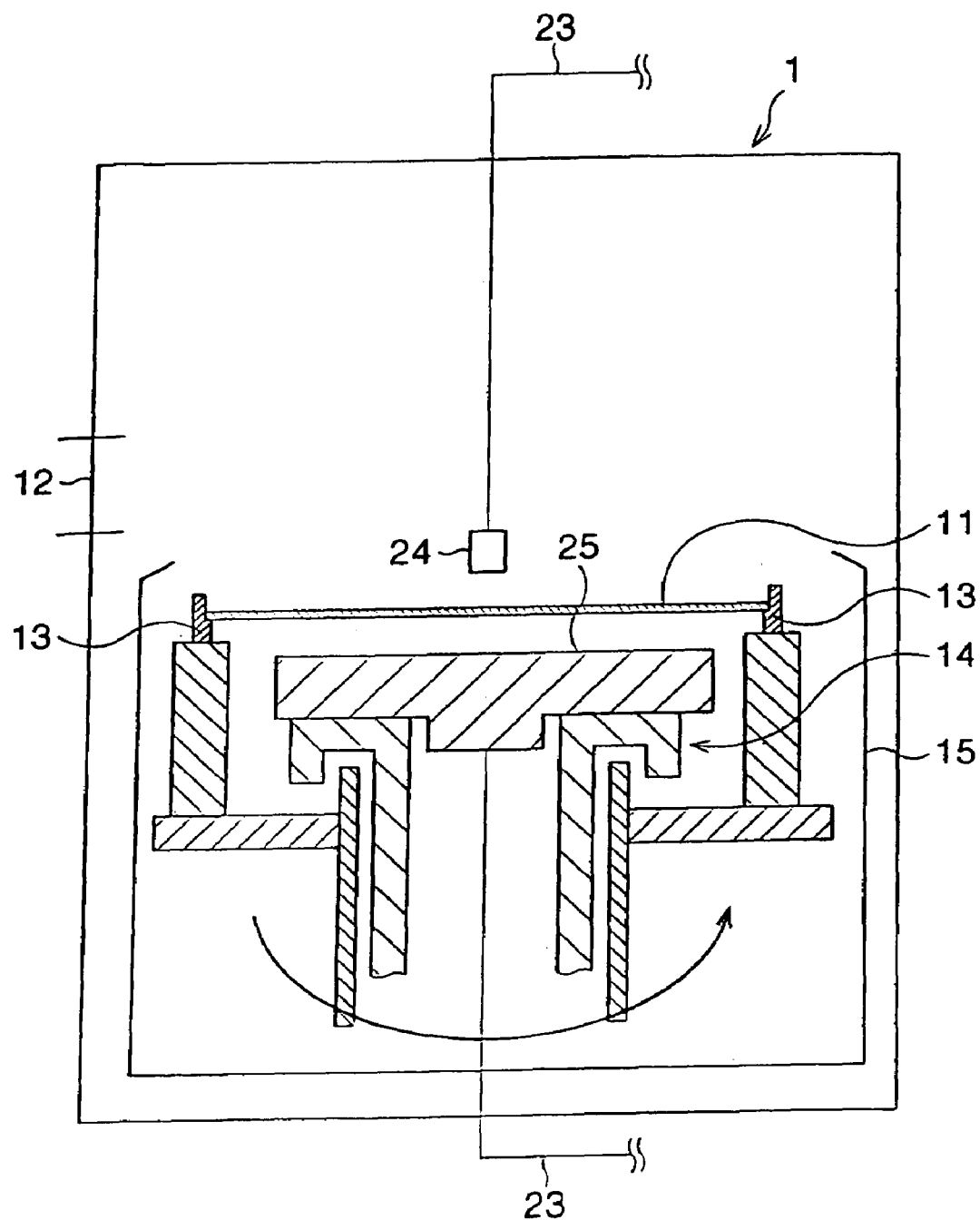
FIG. 2 is a schematic sectional view showing an example of cleaning chamber that is a component of the single wafer spin cleaning apparatus according to the first example.
Figure 3:
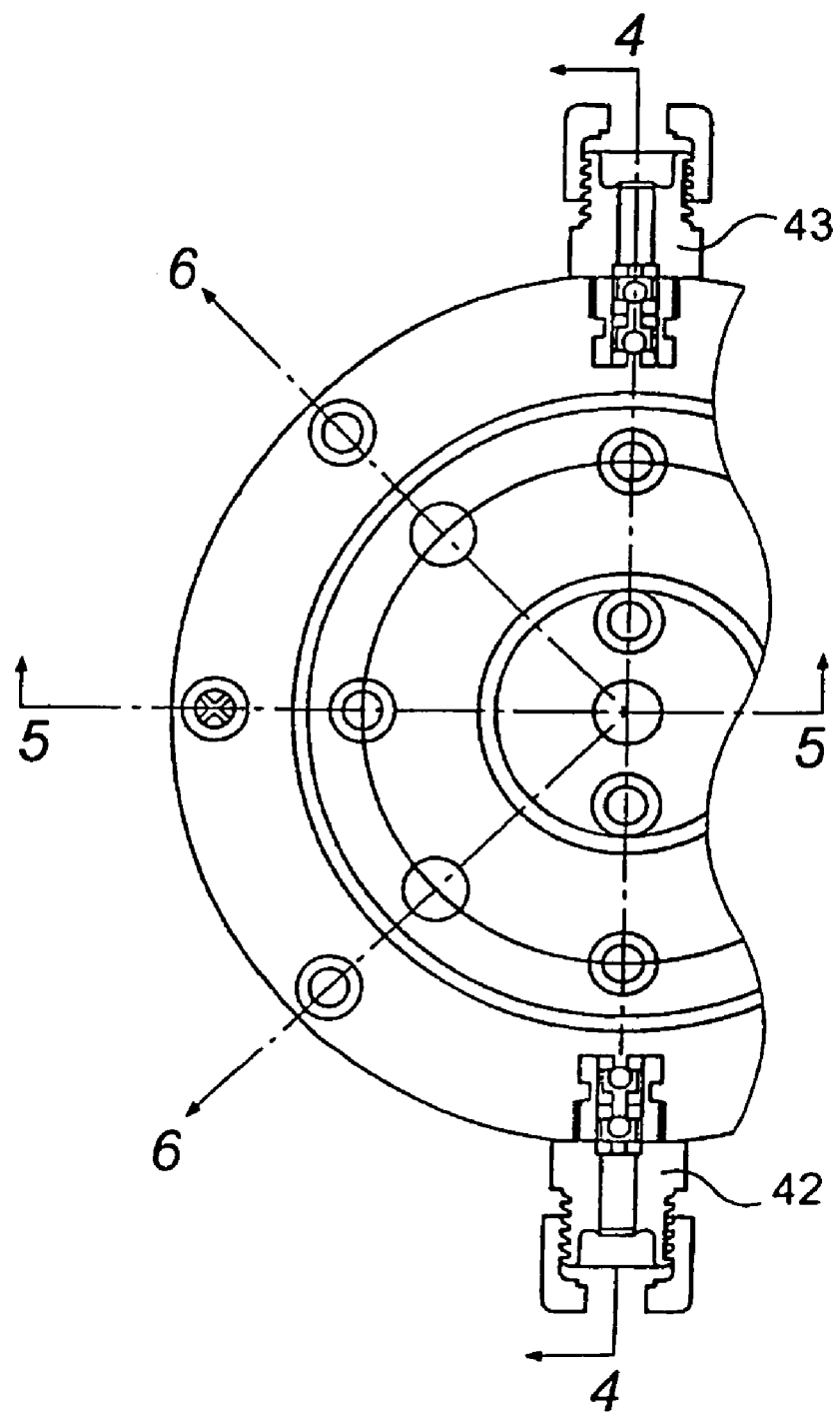
FIG. 3 is a schematic front view showing a chemical supply pump that is a component of the chemical supply system.
Figure 4:
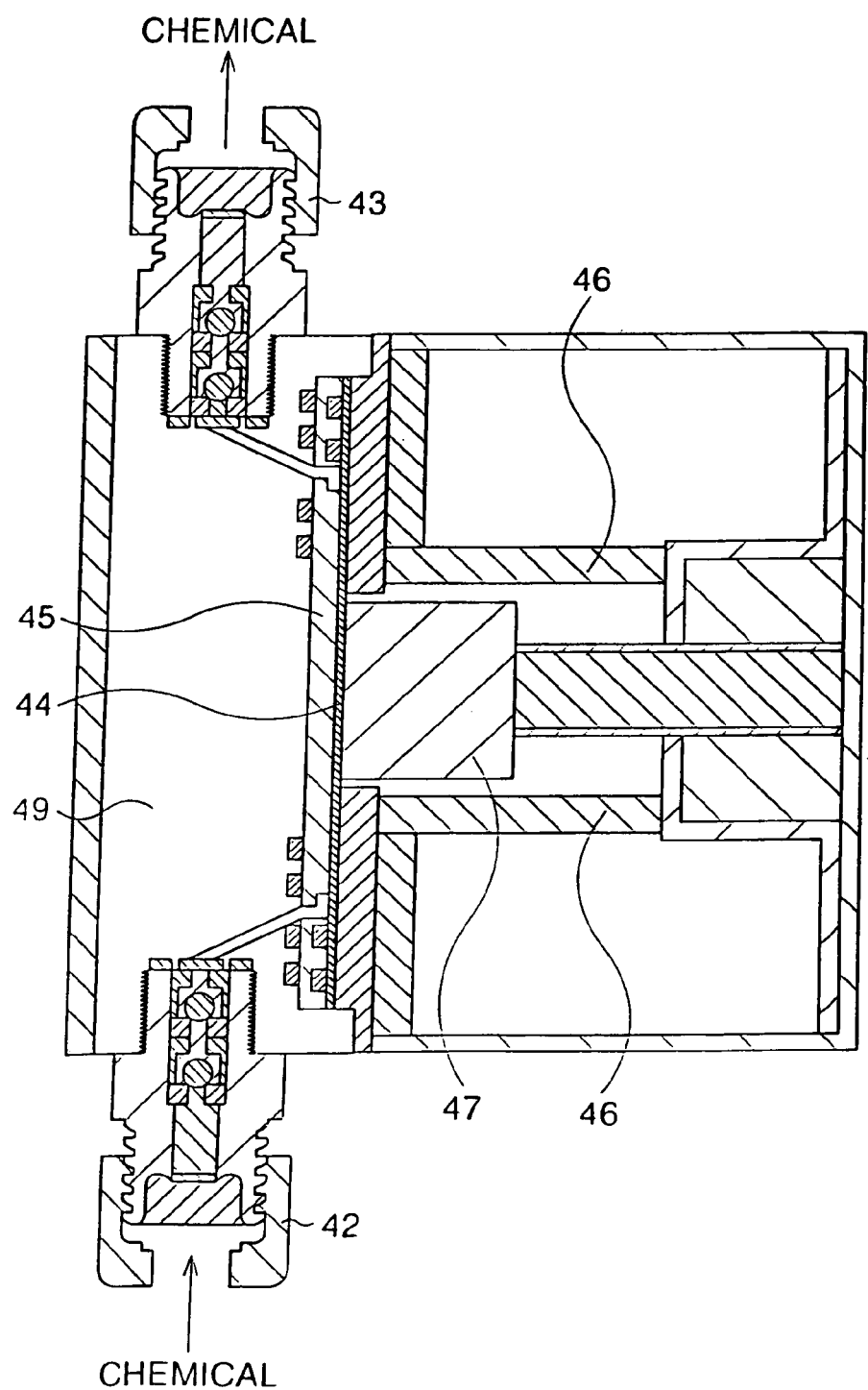
FIG. 4 is a schematic sectional view taken along line 4—4 in FIG. 3.

As shown in FIG. 2, the cleaning chamber 1 defines a closed space wherein the wafer 11 to be cleaned is received, and is provided with a gate valve 12 that is a taking in/out portion for the wafer 11. This cleaning chamber 1 is constructed by comprising a wafer set means 14 having a wafer support pin 13 for supporting the wafer 11 at its side surface, and provided with a rotational drive motor for rotating the fixed wafer 11 in the direction of an arrow in FIG. 2, and a cleaning liquid collision buffer plate 15 disposed to enclose the wafer set means 14 from the side. Here, the cleaning liquid collision buffer plate 15 is not always necessary. By making the shape of the cleaning chamber have a slightly curved surface, the function of the cleaning liquid collision buffer plate 15 can be replaced.

In the cleaning chamber 1, provided is a nozzle (not shown) for supplying $N_2$ gas, an inert gas, or the like. It is possible to dry the wafer 11 by the manner of rotating it at a high speed with blowing $N_2$ gas or the like against the front surface or both the front and back surfaces of the wafer 11 when the wafer 11 is dried after cleaning; to perform cleaning of the wafer 11 in the state that the interior of the cleaning chamber 1 is replaced by $N_2$ gas, an inert gas, or the like, at a high concentration; and so on.

The chemical supply system 2 is constructed by comprising a chemical storage tank 21 in which a liquid chemical for cleaning is stored in the state of its formulated concentrate, a chemical supply apparatus 22 connected to the chemical storage tank 21 for positively performing chemical supply, a piping system 23 connected to the chemical supply apparatus 22 to form a supply flow passage that is a passage for ultrapure water which the liquid chemical is to be mixed with, a pair of discharge nozzles 24 and 25 disposed at end portions of the piping system 23 so as to oppose the surfaces of the wafer 11 set in the cleaning chamber 1 to supply a cleaning liquid onto the surfaces, and a control system 26 for regulating various conditions such as the concentration and flow rate of the cleaning liquid supplied from the discharge nozzles 24 and 25.

The chemical storage tank 21 stores a liquid chemical in the state of its formulated concentrate at a high concentration, here, e.g., hydrogen fluoride (HF), and has a small size easy to move for taking in/out or the like. There is also a case of providing a plurality of chemical storage tanks 21 according to the kinds or the like of liquid chemicals.

The chemical supply apparatus 22 is constructed by comprising a chemical supply pump 31 that is a diaphragm pump performing actions of feeding out a liquid chemical in an oscillation manner from the chemical storage tank 21 by utilizing piezoelectric effect, a connecting pipe 32 which connects the piping system 23 and the chemical supply pump 31 to form a connecting flow passage, a tubule member (capillary) 33 in the connecting pipe 32 for directly connecting to the supply flow passage of the piping system 23.

As shown in FIGS. 3 to 6 and FIG. 7, in the chemical supply pump 31, a flow passage 41 for passing the liquid chemical is formed. A suction valve 42 which is closed due to pressure rise of the liquid chemical is provided at the inlet port of this flow passage 41, and a discharge valve 43 which is closed due to pressure fall of the liquid chemical is provided at the outlet port of the flow passage 41. Here, a pair of opposing side walls 44 and 45 constituting part of a liquid contact surface in the flow passage 41 is made of a compact member with non-permeability and a high anti-corrosion property to the liquid chemical, here, amorphous carbon that is a conductive member, as the principal material, and the side wall 44 is made into a movable wall. As the above compact member, ceramics or sapphire may be used instead of amorphous carbon.

And, this chemical supply pump 31 is constructed by comprising a piezoelectric oscillator 46 that is a shaker connected to this side wall (movable wall) 44 for oscillating the movable wall 44 in directions substantially perpendicular to its wall surface to change the volume of the flow passage 41 periodically, a drive transmission means 47 disposed between the movable wall 44 and the piezoelectric oscillator 46 for transmitting the oscillation from the piezoelectric oscillator 46, and springs 48 that are means that it is considered that the piezoelectric oscillator 46 can generate no pressure in its shrinkage direction, for elastically biasing the drive transmission means 47.

Amorphous carbon that is the principal material of the side walls 44 and 45, has non-permeability and a high anti-corrosion property as described above, and has the nature that it does not receive any contamination in relation to the liquid chemical used for cleaning the wafer 11, in particular, oxidizing agent such as hydrogen fluoride, a hydrogen peroxide solution, and ozone. As amorphous carbon used here, uniform amorphous carbon, fibrous amorphous carbon, or a complex material of both is preferable. Uniform amorphous carbon is a material having a compact isotropic structure without pores and superior in gas barrier and liquid interception properties, and is possible to control the porosity in accordance with the application. Fibrous amorphous carbon is a carbon porous body having a three-dimensional skeletal structure, and porous carbon having uniformity of pores.

Here, experimental examples in which non-permeability/high anti-corrosion property of amorphous carbon were examined, will be described. In this experiment, a supply line from the fluoric acid formulated concentrate to a dilute fluoric acid preparation system was constructed using amorphous carbon piping (the outside diameter of about 6 mm and the inside diameter of about 4 mm) with the porosity of 0%, and the elution degrees of various metals in case of repetitive use were examined. The following table shows the experimental results.

| Eluted ingredient concentration: ppb. | | | | | | | | |
|---|---|---|---|---|---|---|---|---|
| eluted ingredient | Al | Ca | Mg | Na | Fe | Ni | Cr | Ti |
| eluted ingredient concentration one week after | <1 | <1 | <1 | <1 | <1 | <1 | <1 | <1 |
| eluted ingredient concentration one month after | <1 | <1 | <1 | <1 | <1 | <1 | <1 | <1 |

Sample area: 40 × 10 × 2 (mm) HF50% quantity used: 1 (kg)

Even when long use over one month is repeated in this manner, it is found that any eluted ingredient is not given to the fluoric acid formulated concentrate at a high concentration (HF 50%). Accordingly, preparation of highly pure dilute fluoric acid becomes possible by using this amorphous carbon.

In a conventional chemical supply system constructed with a fluororesin, because diffusion of HF molecules in the fluororesin is inevitable, there is the defect that slight HF diffusion can not be suppressed in a long term. As this example, by applying amorphous carbon to a liquid contact portion, this problem can be solved.

Figure 8A:
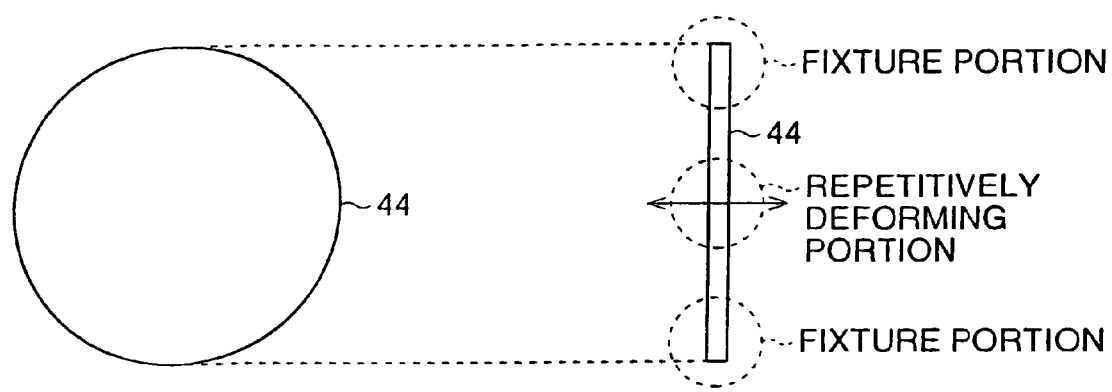
FIGS. 8A and 8B are schematic sectional views showing a movable wall that is a component of the chemical supply pump.
Figure 8B:
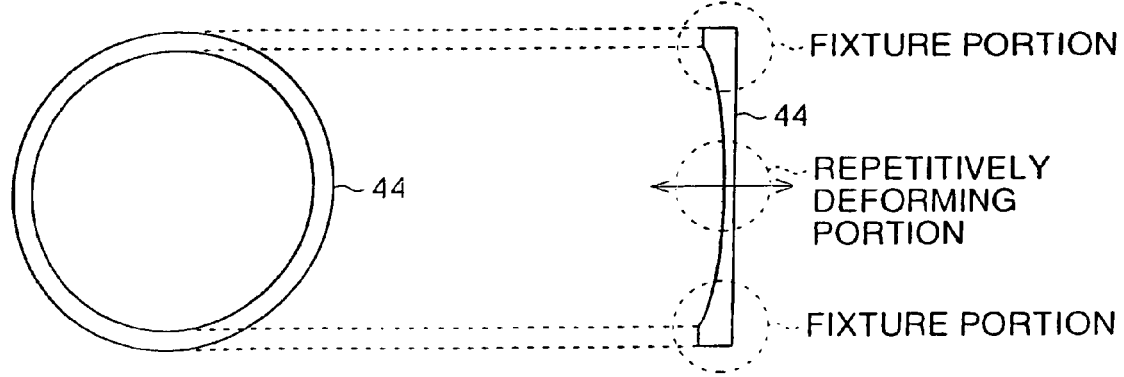
Figure 9:
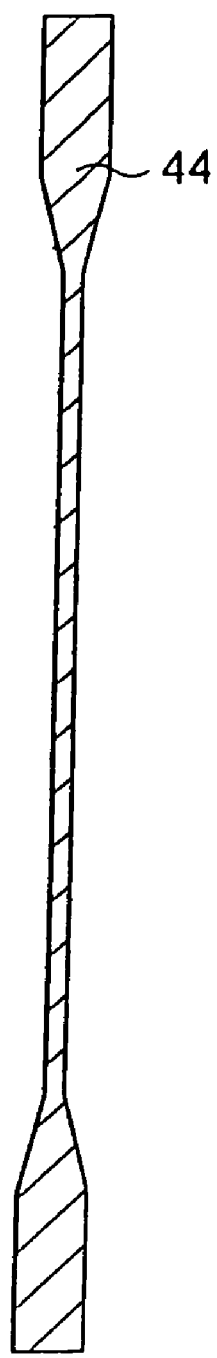
FIG. 9 is a schematic sectional view showing another suitable example of movable wall.

The movable wall 44 functions as a diaphragm, and has a shape that becomes thicker from the center to the periphery, as shown in FIG. 8B. This shape is the optimum shape for dispersing the mechanical stress acting on one portion in consideration of reinforcement of the vicinity of the periphery that is the fixture portion, in addition to that the portion that the pressure received by the movable wall 44 becomes the maximum is near the center, and here becomes the portion deforming repeatedly in particular. As shown in FIG. 8A, in case that the movable wall 44 has a uniform thickness for example, the mechanical stress is concentrated near the center and the durability may be detracted. As shown in FIG. 9, it is also suitable that the movable wall 44 is formed so as to become thicker from the center to the periphery and have a sectional shape laterally symmetrical in the drawing.

Figure 10A:
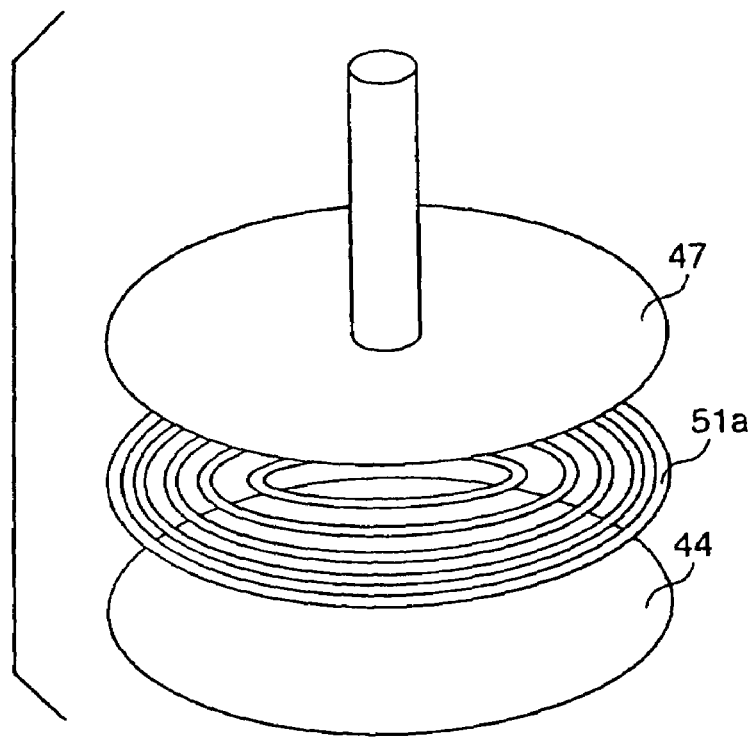
FIGS. 10A and 10B are schematic perspective views showing auxiliary members of the movable wall.
Figure 10B:
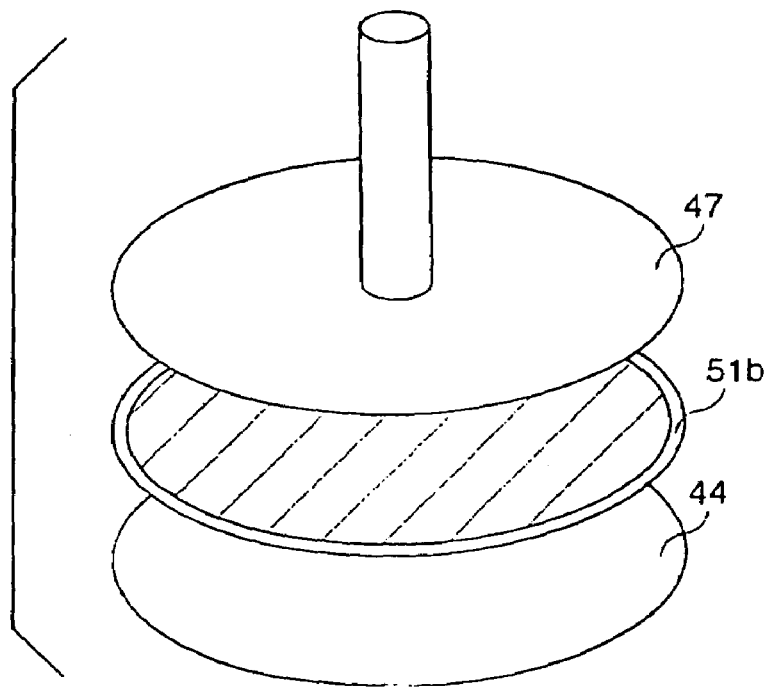

Further, as shown in FIGS. 10A and 10B, between the movable wall 44 and the drive transmission means 47, provided is an auxiliary member 51 for uniformly transmitting the pressure from the drive transmission means 47 to the movable wall 44 to disperse the mechanical stress. As a concrete example of this auxiliary member 51, preferable is a concentric O-ring group 51a made of rubber or an elastic adhesive and having a shape according to the pressure, as shown in FIG. 10A, a sheet 51b producing the same effect as the O-ring group 51a, as shown in FIG. 10B, or the like.

Figure 11A:
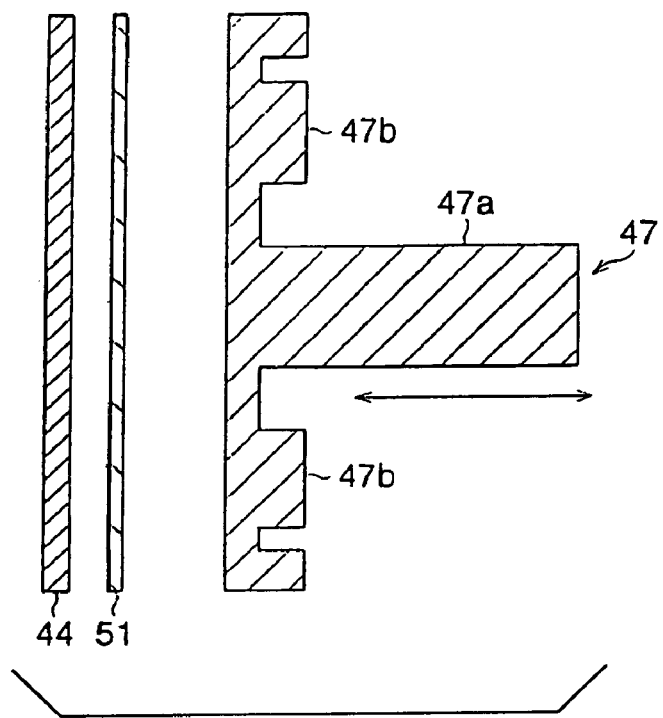
FIGS. 11A and 11B are schematic sectional views showing a drive transmission means that is a component of the chemical supply pump, and a state of reaction on the movable member.
Figure 11B:
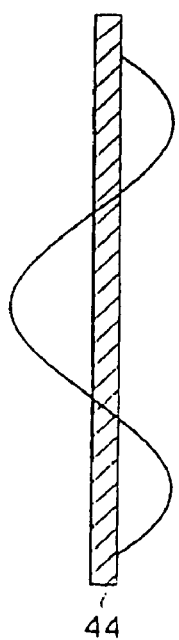

The drive transmission means 47 is made of SUS, in which, in anticipation of reaction received from the liquid chemical when the direct oscillation transmission portion (near the center) to the movable wall 44 is pressed, the portions near the center and where the above reaction is great are formed to be thicker, as shown in FIG. 11A. That is, as shown in FIG. 11B, when the maximum pressure acts on the vicinity of the center of the movable wall 44, the reaction from the liquid chemical in the flow passage 41 becomes the maximum near the periphery of the movable wall 44. So, if the drive transmission means 47 is formed into a shape that the thickness of the peripheral vicinity 47b successive to the central vicinity 47a is great as shown in the drawing in anticipation of this reaction, the pressure acting on the movable wall 44 becomes substantially uniform on the whole. In this case, for suppressing the deformation of the auxiliary member 51 due to a vertical force in FIG. 11A, as small as possible, it is preferable to make cuts or the like in the auxiliary member 51.

Figure 12:
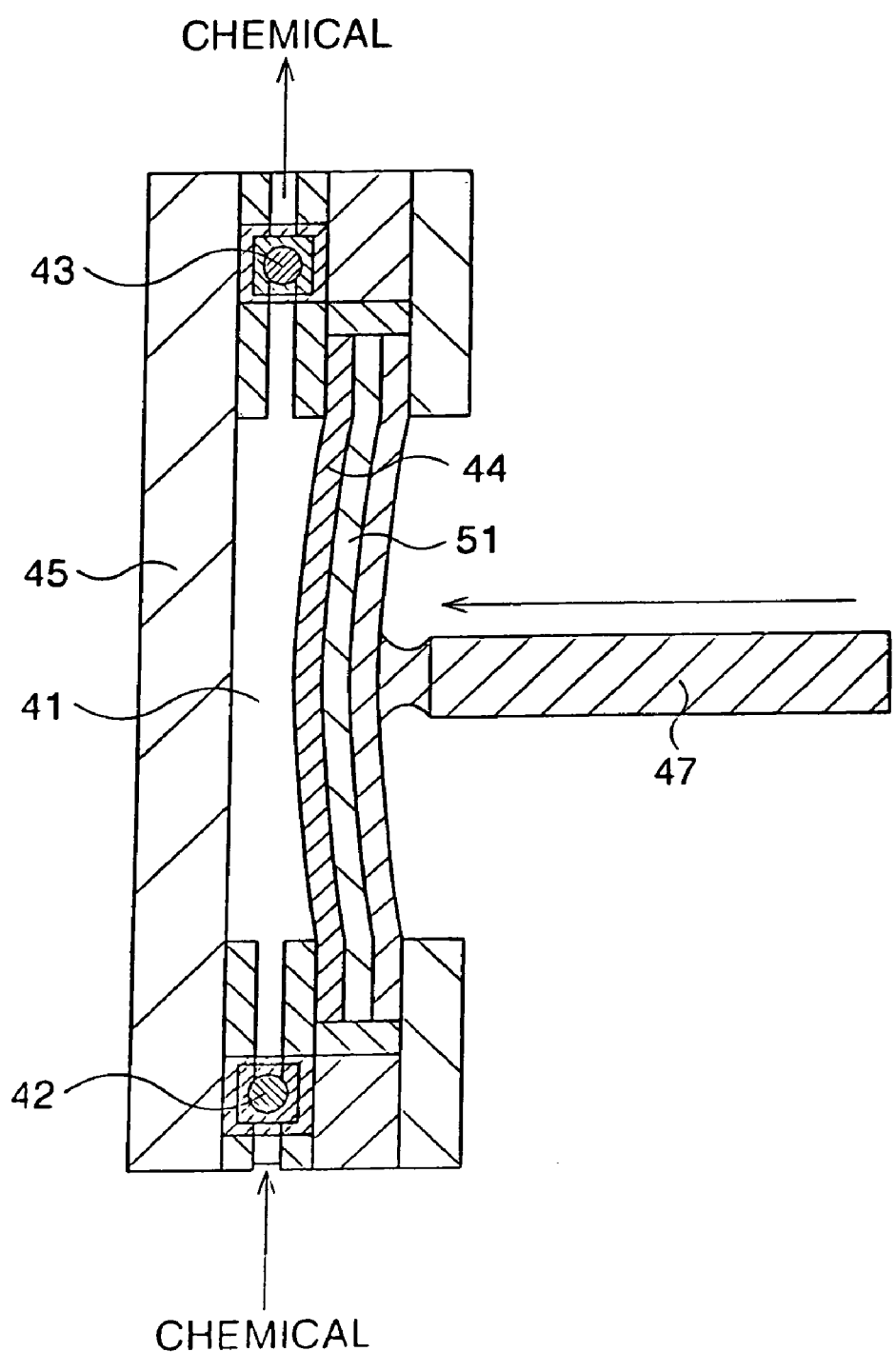
FIG. 12 is a schematic sectional view showing a vicinity of the flow passage when the chemical supply pump drives.

The operation of this chemical supply pump 31 is as follows. When the movable wall 44 that is a diaphragm moves rightward in FIG. 7, the flow passage 41 becomes at a negative pressure and the discharge valve 43 becomes the closed state. When it moves leftward as shown in FIG. 12, the flow passage 41 becomes at a positive pressure and the suction valve 42 becomes the closed state, and the discharge valve 43 becomes the open state to discharge the liquid chemical. Here, it is preferable to control the oscillation frequency of the movable wall 44 by drive of the piezoelectric oscillator 46, in the degree of 20 Hz for example, and it is suitable that the discharge pressure of the liquid chemical is 1.5 kg/cm$^2$ or more for example.

The capillary 33 that is a tubule member is made of amorphous carbon similar to the side walls 44 and 45 as the principal material, and the tube diameter is, e.g., in the degree of φ 0.2 mm, and the discharge quantity is, e.g., 0.3 cc/sec. By oscillation drive of the chemical supply pump 31, the liquid chemical is discharged from this capillary 33 into ultrapure water in the piping system 23.

The piping system 23 forms a supply flow passage for ultrapure water as described above, and the tube diameter is, e.g., in the degree of φ 5 mm, and the flow rate is, e.g., in the degree of 3.4 l/min. In this piping system 23, provided are a flow rate regulation means 34 for regulating the flow rate of ultrapure water passing through the piping system 23, a concentration regulation means 35 for regulating the concentration of the cleaning liquid passing through the piping system 23, and a mixing means 36 disposed at the connecting portion to the capillary 33 of the piping system 23 for producing a rotational flow in the cleaning liquid to stir and uniformize the cleaning liquid. These flow rate regulation means 34, concentration regulation means 35, and mixing means 36 will be described later in detail. The discharge conditions of the liquid chemical into the piping system 23 are as follows.

In general, a flow that the passage quantity per unit time is constant even in any section of a fluid passing through a tube, is called constant flow. In constant flow, there are two forms of laminar flow and turbulent flow. Laminar flow is a flow that the flow axis keeps a linear shape in relation to the flow passage axis, and the flow rate is relatively small. On the other hand, turbulent flow is a flow that the flow axis becomes a state of irregularly whirling, and the flow rate is relatively great. It is known that conditions for appearance of laminar flow and turbulent flow are classified by so-called Reynolds number. In case of the Reynolds number of 2000 or less, even when the flow axis is disturbed by adding stirring, the downstream returns to laminar flow. The range of the Reynolds number of 2300 to 3000 is considered the boundary (critical Reynolds number) between laminar flow and turbulent flow.

Here, when the Reynolds number is R (no dimension), the inside diameter of the tube is D (cm), the linear velocity of the liquid is u (cm/sec), the dynamic viscosity of the liquid is ν (cm$^2$/sec), the viscosity of the liquid is η (dyn.sec), and the density of the liquid is ρ (g/cm$^3$), the Reynolds number R is expressed by:

$$R = D \cdot u / \nu$$
$$= D \cdot u \cdot \rho / \eta.$$

FIGS. 13A through 13E are typical views showing chemical diffusion patterns at a mixing point P of a liquid chemical and ultrapure water in this example.

First, as a comparative example, a chemical diffusion pattern when the connecting tube 32 is directly connected to the piping system 23 without using capillary 33, is shown in FIG. 13A and FIG. 13B. In this case, because the linear velocity of ultrapure water is larger than the linear velocity of the liquid chemical, laminar flow of ultrapure water is not disturbed and the liquid chemical is transported along the tube wall as it is in the non-diffusion state.

In comparison with that, in case of this example, as shown in FIGS. 13C–13E, by selecting the capillary 33, by applying a pressure at which that the linear velocity of the liquid chemical discharged from the capillary 33 is sufficiently larger than the linear velocity of ultrapure water (for example, the pressure at which it is injected at the flow velocity about ten times of the flow velocity of ultrapure water), to the liquid chemical by the chemical supply pump 31, the liquid chemical reaches the opposite wall surface of the piping system 23 in ultrapure water. The chemical diffusion pattern at this time has a shape elongated in the flowing-out direction by laminar flow in viewing from the side, a shape such that the tip end of the chemical flow is separated to both sides by collision against the opposite wall surface and further elongated in the flowing-out direction, in viewing from the upside. That is, in this case, a mixture solution (cleaning liquid) of the liquid chemical and ultrapure water is compounded at a uniform concentration and transported through the piping system 23.

The control system 26 comprises a chemical supply control means 37 for controlling the supply quantity of the liquid chemical to ultrapure water of the chemical supply pump 31, and driving the flow rate regulation means 34, and a concentration control means 38 for driving the concentration regulation means 35. And, the chemical supply control means 37 and the concentration control means 38 are connected, the result of the concentration control by the concentration control means 38 is fed back to the chemical supply control means 37 to control the chemical supply pump 31, and the supply quantity of the liquid chemical is regulated. Control to various additional systems described later is also made by the control system 26.

Figure 14:
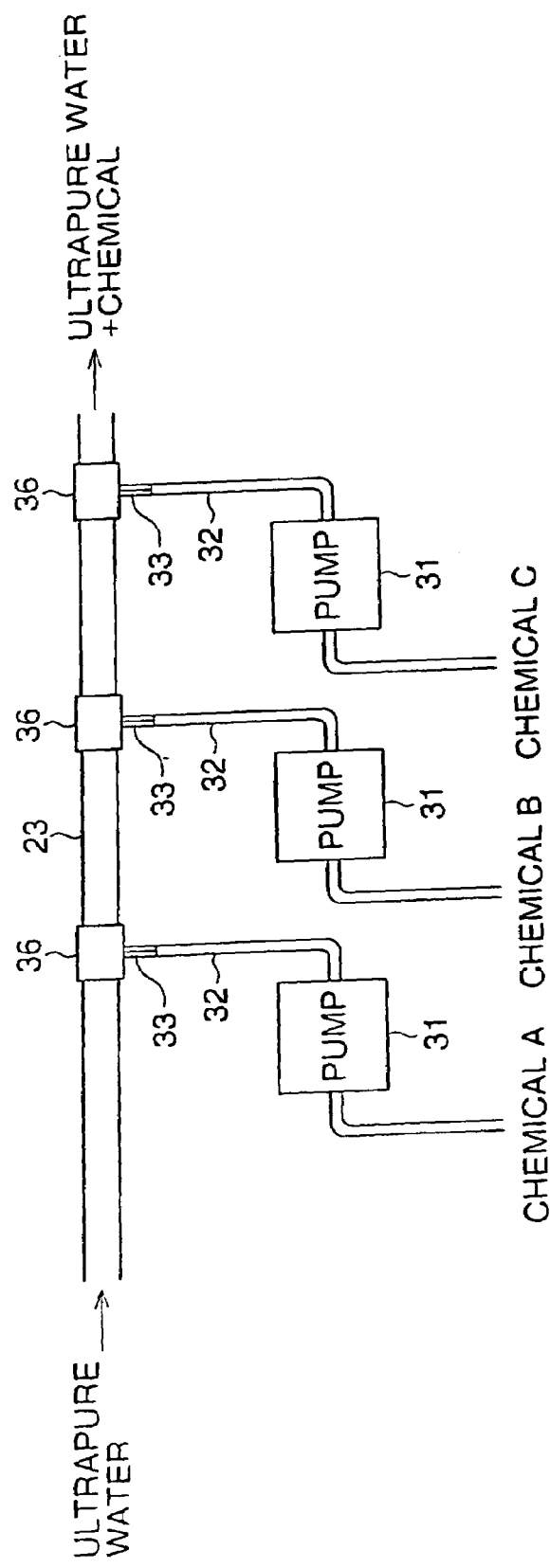
FIG. 14 is a typical view showing a case of providing a plurality of chemical supply apparatus.

As shown in FIG. 14, there is a case that a plurality of chemical supply apparatus 22 (three of A, B, and C in the example shown in the drawing) is provided. In this case, each chemical supply apparatus 22 arbitrarily drives, and mixes each liquid chemical to ultrapure water passing through the supply flow passage of the piping system 23, in a desired order, and desired cleaning liquids are supplied to the wafer 11 surface in order from the discharge nozzles 24 and 25.

In this manner, in the substrate cleaning apparatus of this example, first by the chemical supply pump 31, the piezoelectric oscillator 46 drives and controls the movable wall 44 to oscillate, and the liquid chemical is discharged by the pressure, and a desired quantity of the liquid chemical can be discharged and supplied with accuracy. Here, used is a compact member, preferably, amorphous carbon, that at least part of the liquid contact surface has non-permeability and a high anti-corrosion property to the liquid chemical. This amorphous carbon is a material easy to control its porosity, and one whose-porosity is substantially zero is very superior in non-permeability and the high anti-corrosion property. Accordingly, by providing this amorphous carbon on the important portion of the liquid contact surface, the supply quantity control of the liquid chemical becomes more accurate, and mixing of particles or the like into the liquid chemical is suppressed.

Further in this example, provided is the chemical supply apparatus 22 including this chemical supply pump 31 as a component. This chemical supply apparatus 22 mixes the liquid chemical from the capillary 33 with ultrapure water passing through the piping system 23 by drive of the chemical supply pump 31, and mixture solutions (cleaning liquids) at various concentrations can easily be compounded at need. Here, in case that the discharge direction of the liquid chemical is a direction substantially perpendicular to the flow direction of ultrapure water, by applying a pressure to the liquid chemical such that the linear velocity of the liquid chemical discharged from the tubule member is sufficiently larger than the linear velocity of ultrapure water passing through the piping system 23, the liquid chemical reaches the opposite wall surface of the piping system 23 in ultrapure water, and a mixture solution at a uniform concentration is compounded in a moment.

Further in this example, provided is the chemical supply system 2 including the chemical supply apparatus 22 as a component and for supplying a cleaning liquid. In this chemical supply system 2, because it is possible to produce cleaning liquids at desired concentrations at need as described above, enough is the easily movable small-sized reservoir 21 of the liquid chemical that is the formulated concentrate. That is, in this chemical supply system 2, there is no necessity of providing very large reservoirs for mixture solutions different in chemical concentration and kind as conventionally, and not only particle mixing to a cleaning liquid, or the like, can be suppressed, but also remarkable reduction/simplification of the scale of the whole system can be realized. Accordingly, in the substrate cleaning apparatus of this example provided with this chemical supply system 2, it becomes possible rapidly and easily to supply various pure cleaning liquids different in concentration and kind.

In the substrate cleaning apparatus of this example, in order to ensure the further suppression of particle generation or the like and the accuracy of the chemical concentration of the cleaning liquid, various additional systems as shown hereinafter are provided to the chemical supply system constructed as described above.

First, a mixing prevention system (chemical discharge stop means) 39 of remaining chemical when chemical injection to ultrapure water in the piping system 23 is stopped, will be described.

Figure 15:
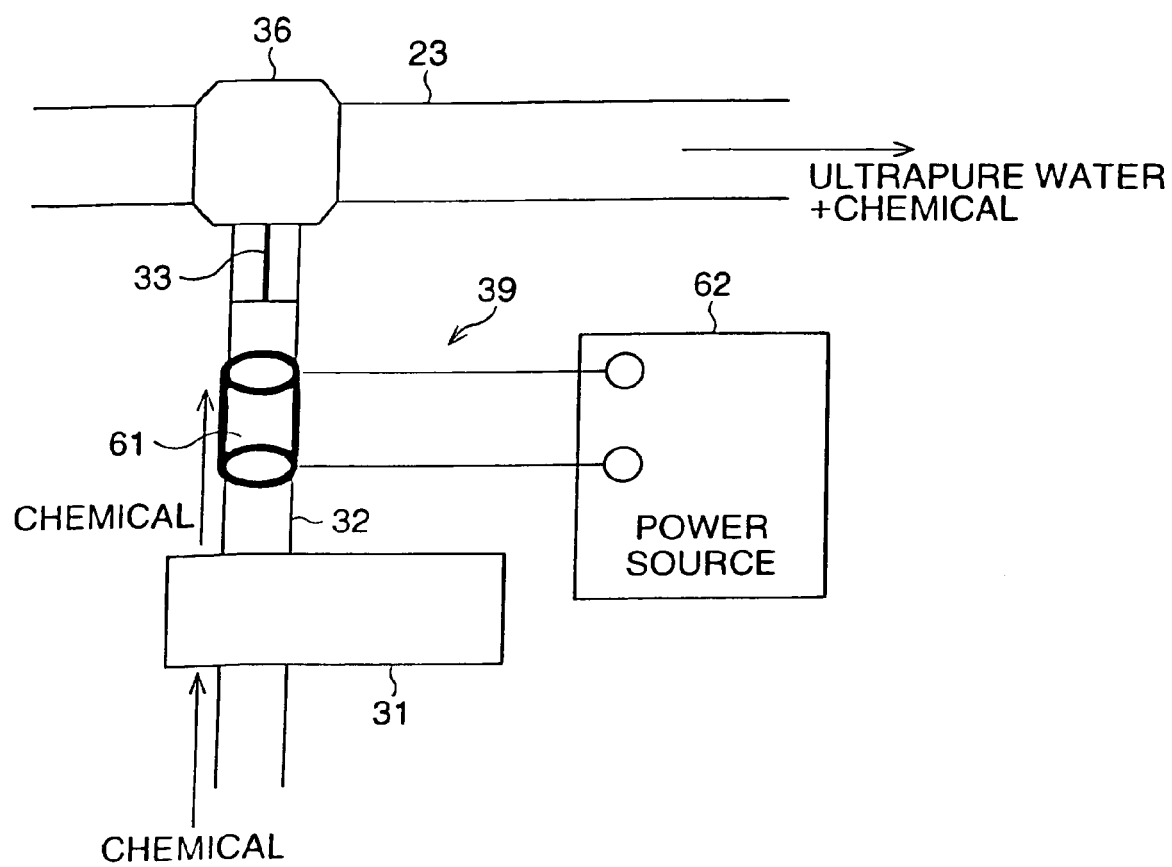

FIG. 15 is a typical view showing a concrete example of the mixing prevention system 39. Here, exemplified is a so-called suck-back device having an electric heating system. This suck-back device 61 is made of amorphous carbon as the principal material, and provided so as to cover part of the connecting tube 32. An electric power source 62 synchronous with drive/stop of the chemical supply pump 31 is connected to this suck-back device 61, and the liquid chemical near the suck-back device 61 is heated to a predetermined temperature by the heat transfer system of the suck-back device 61 in the state of the power source 62 being ON when the liquid chemical is supplied. When the chemical supply pump 31 is stopped, although the power source 62 becomes OFF synchronously with that, since the pressure produced due to flowing of ultrapure water closes the discharge valve 43 of the chemical supply pump 31 through the capillary 33, the liquid chemical slightly contracts due to natural cooling, and with that, some quantity of ultrapure water in the piping system 23 is sucked from the capillary 33 to the chemical supply pump 31 side. Thereby, the interior of at least a portion in the capillary 33 in direct contact with ultrapure water in the piping system 23 is replaced by ultrapure water, and the liquid chemical is completely intercepted from ultrapure water in the piping system 23.

Besides, a suck-back device having a compression system may be used instead of the suck-back device 61. In this case, for example, a solenoid is formed by winding on the suck-back device made of a plastic, and it is constructed such that a current to the solenoid is made OFF synchronously with stop of the chemical supply pump 31. In general, the solenoid slightly expands radially by OFF of the current, and thereby some quantity of ultrapure water is sucked from the capillary 33.

Figure 16:
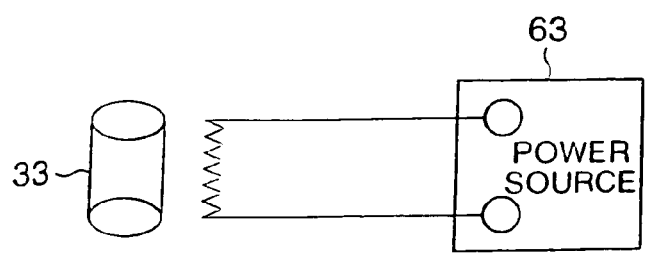

Besides, utilizing that the capillary 33 has electrical conductivity, an electric heater 63 synchronous with drive/stop of the chemical supply pump 31 may be provided to the capillary 33, as shown in FIG. 16. In this case, like the function of the above suck-back device 61, when the electric heater power source 63 is made OFF synchronously with stop of the chemical supply pump 31, the liquid chemical slightly contracts due to natural cooling, and with that, some quantity of the liquid chemical is sucked from the capillary 33 and completely intercepted from ultrapure water in the piping system 23. This mixing prevention system using the capillary 33 is suitable even when it is used together with the above suck-back device.

Figure 17:
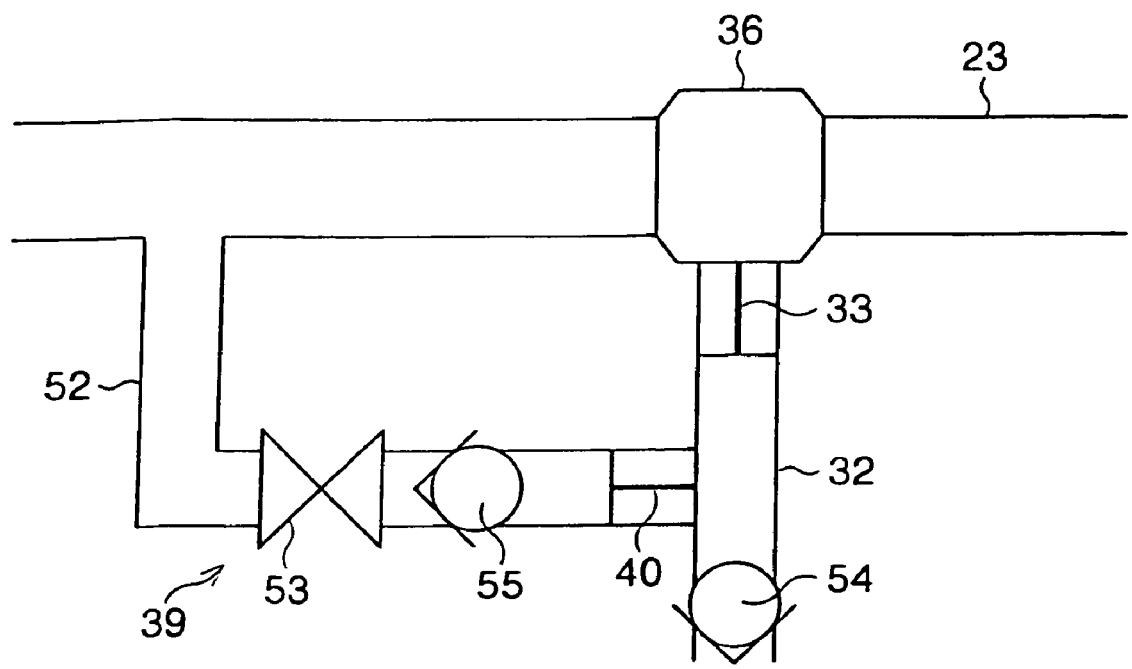

Besides, as shown in FIG. 17, a mixing prevention system 39 may be constructed by having a connecting tube 52 connected directly to part of the connecting tube 32 in the vicinity of the capillary 33 and connected to the portion corresponding to the upstream of ultrapure water of the connecting portion of the capillary 33 of the piping system 23, and providing a capillary 40 that is another tubule member connected directly to that portion of the piping system 23 in the connecting tube 52. In this case, the mixing prevention system 39 operates such that the valve 53 is opened synchronously with stop of the chemical supply pump 31, ultrapure water is supplied from the capillary 40 into the connecting tube 32, and remaining liquid chemical in the connecting tube 32 is pushed out to the piping system 23 side. At this time, because the check valve 54 provided integrally with the chemical supply pump 31 (only the check valve 54 is shown in FIG. 17 for convenience' sake) is present, the remaining liquid chemical does not flow to the chemical supply pump 31 side, and flows to the capillary 33 side. Thereby, the remaining liquid chemical is pushed out to the piping system 23 side. And, the valve 53 is closed synchronously with operation start of the chemical supply pump 31, and by action of the check valve 55 provided in the connecting tube 52 between the valve 53 and the capillary 40, the liquid chemical is prevented from flowing out into the connecting tube 52. According to this mixing prevention system 39, remaining liquid chemical can easily and surely be prevented from being diffused in the piping system 23.

Next, a system for detecting bubble generation in the liquid chemical in chemical supply, and damage on the movable wall 44 easiest to be breaking down due to drive of the chemical supply pump 31, or the like, will be described.

Figure 18:
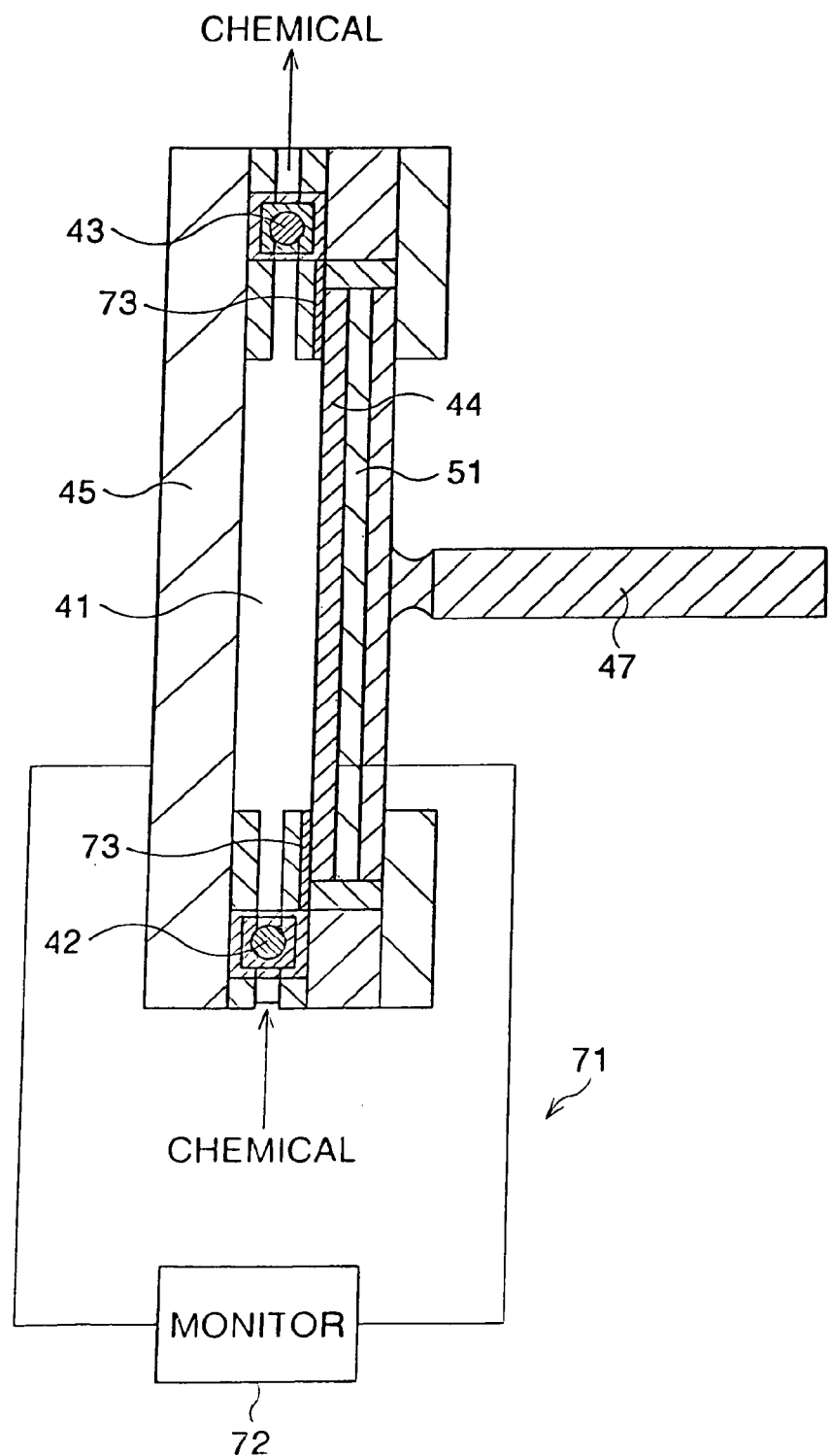
FIG. 18 is a typical view showing a concrete example of bubble/breaking down detection system.

FIG. 18 is a typical view showing a concrete example of the bubble/breaking down detection system.

In this bubble/breaking down detection system 71, utilizing that the side walls 44 and 45 of the chemical supply pump 31 have electrical conductivity, a capacitor is formed by regarding them as opposed electrodes and using the liquid chemical in the flow passage 41 as a dielectric substance, and the electrostatic capacity of this capacitor is monitored by an electrostatic capacity monitor 72 connected to the opposed electrodes. In this case, in order to ensure the certain capacitor function of the side walls 44 and 45, it is preferable to insert an insulating material 73 into the fixture portion (this portion is also made of amorphous carbon) of the side wall (movable wall) 44.

The detection operation by the bubble/breaking down detection system 71 will be described with reference to FIGS. 19A to 19C.

Figure 19A:
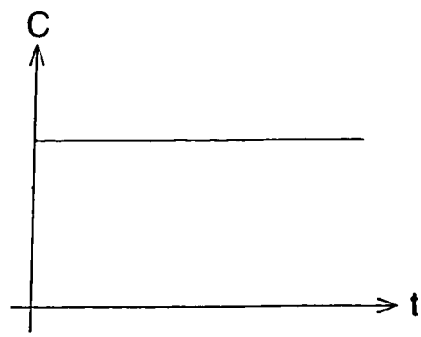
FIGS. 19A to 19C are characteristic graphs showing monitoring electrostatic capacity by the bubble/damage detection system.
Figure 19B:
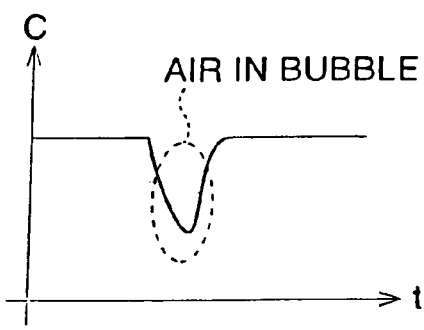
Figure 19C:
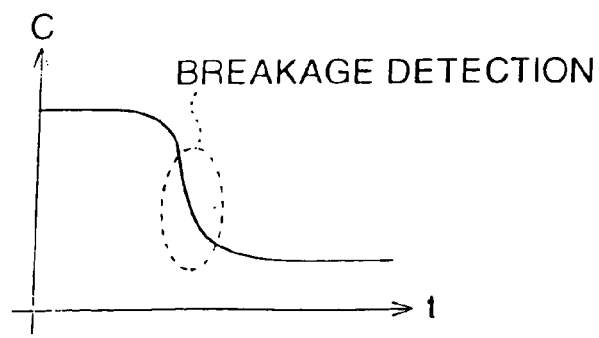

First, when no bubble or no damage is generated, the electrostatic capacity C shows a substantially constant value as shown in FIG. 19A. And, for example, when bubbles are generated in the liquid chemical in the flow passage 41, the electrostatic capacity C falls for the time of passing through the flow passage 41 as shown in FIG. 19B. Besides, when breaking down occurs on the movable wall 44, the electrostatic capacity C falls with the time of the break being a boundary and becomes a substantially constant state at a predetermined value as shown in FIG. 19C. In this manner, by monitoring the electrostatic capacity C, generation of bubbles or break can be detected with ease.

Figure 20A:
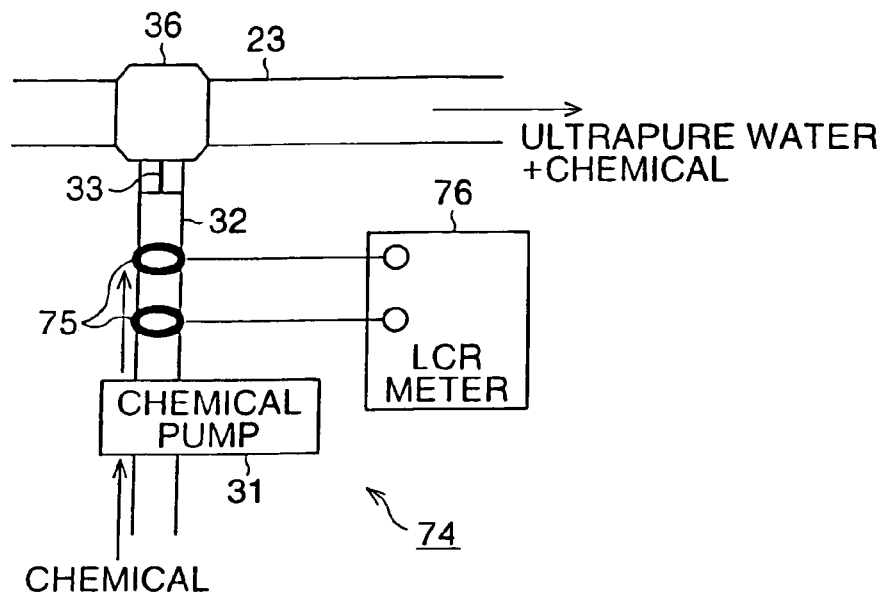
FIGS. 20A to 20C are typical views showing another concrete example of bubble/breaking down detection system.
Figure 20B:
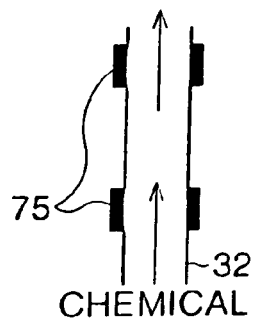
Figure 20C:
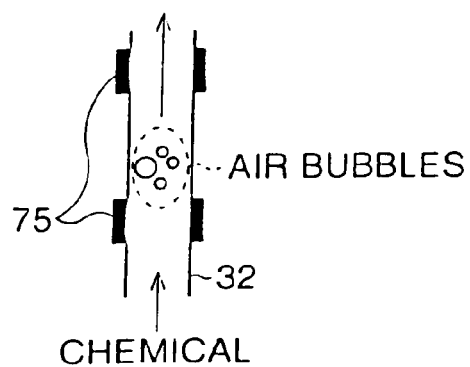

Besides, as another example of bubble detection system, as shown in FIG. 20A, there is a bubble detection system 74 constructed by comprising a pair of e.g., ring-like electrodes 75 disposed on the connecting tube 32, and an LCR meter 76 connected to each electrode 75. FIG. 20B being normalcy, when bubbles are generated in the liquid chemical passing between the electrodes 72 as shown in FIG. 20C, the electrostatic capacity C falls for that time like the above. So, by monitoring the electrostatic capacity C with the bubble detection system 74, generation of bubbles can be detected with ease like the above.

Next, a system for controlling the discharge quantity of the liquid chemical from the chemical supply pump 31 to ultrapure water, and monitoring the flow condition of the cleaning liquid, that is, whether or not the cleaning liquid flows normally.

Figure 21:
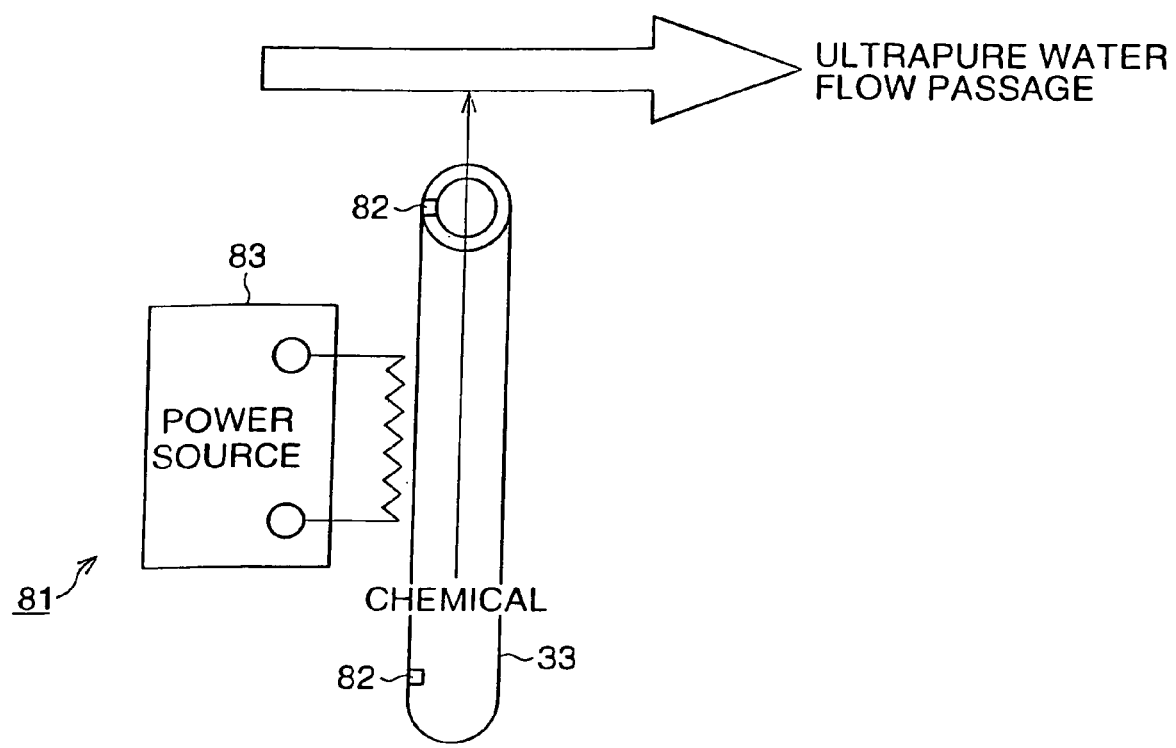
FIG. 21 is a typical view showing a concrete example of cleaning liquid concentration regulation system.

FIG. 21 is a typical view showing a concrete example of the cleaning liquid flow detection system.

This cleaning liquid flow detection system 81 comprises a pair of thermistor temperature detection terminals 82 respectively embedded in both ends of the wall surface of the capillary 33 near the joining portion between the capillary 33 and the piping system 23, and is constructed such that an electric heater 83 heats the capillary 33 to a predetermined temperature synchronously with drive of the chemical supply pump 31.

The temperature difference between the temperature detection terminals 82 is measured by this cleaning liquid flow detection system 81, and thereby a change in flow condition is detected. That is, ultrapure water flows within the piping system 23 in the direction indicated by an arrow in FIG. 21, and a concentration inclination according to the chemical discharge quantity arises between the temperature detection terminals 82. Because this concentration inclination is a function of temperature, by measuring the temperature difference between the temperature detection terminals 82, the chemical discharge quantity is detected. In this manner, according to the cleaning liquid flow detection system 81, it becomes possible to control the flow condition of the cleaning liquid always in a suitable condition.

Next, a system for preventing corrosion due to the liquid chemical or vapor of the liquid chemical in the chemical supply pump 31, will be described.

Figure 5:
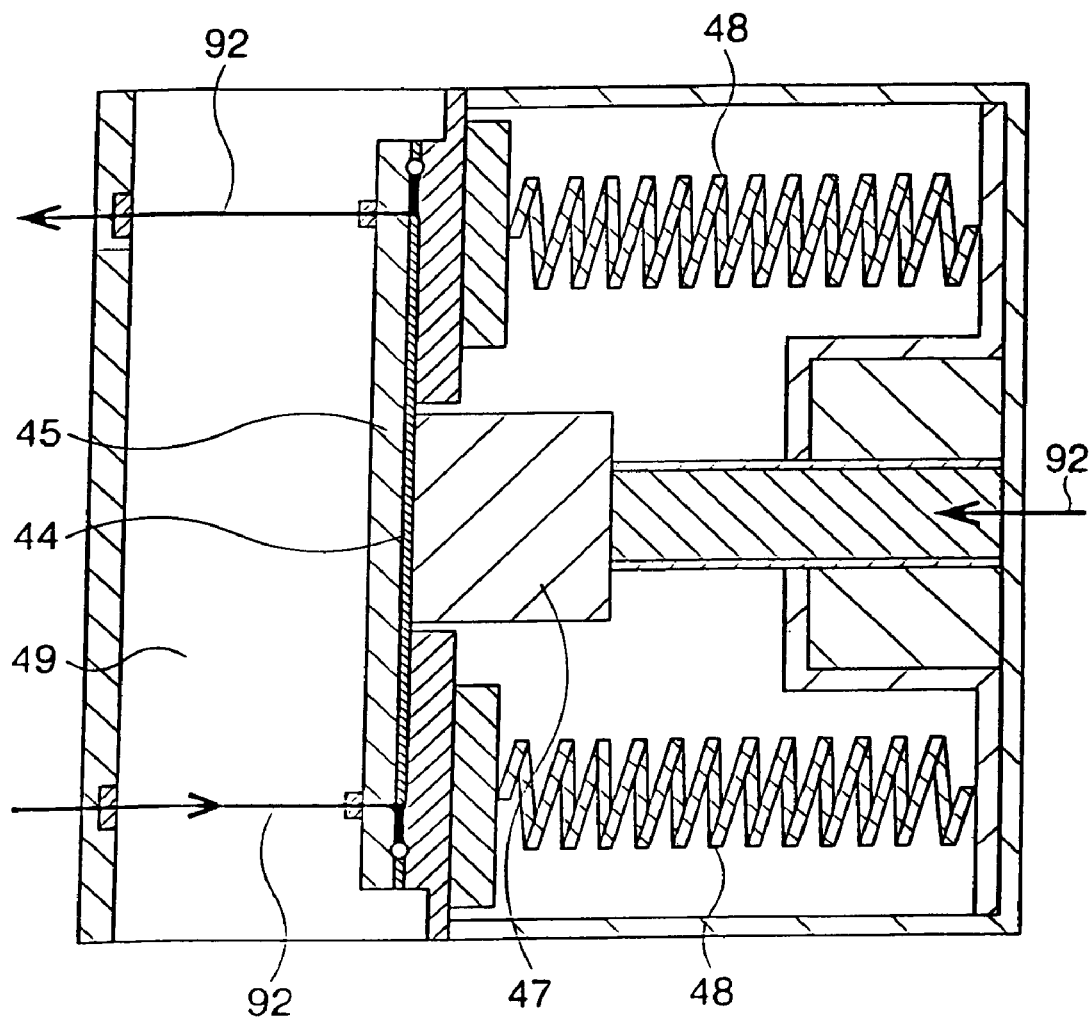
FIG. 5 is a schematic sectional view taken along line 5—5 in FIG. 3.
Figure 6:
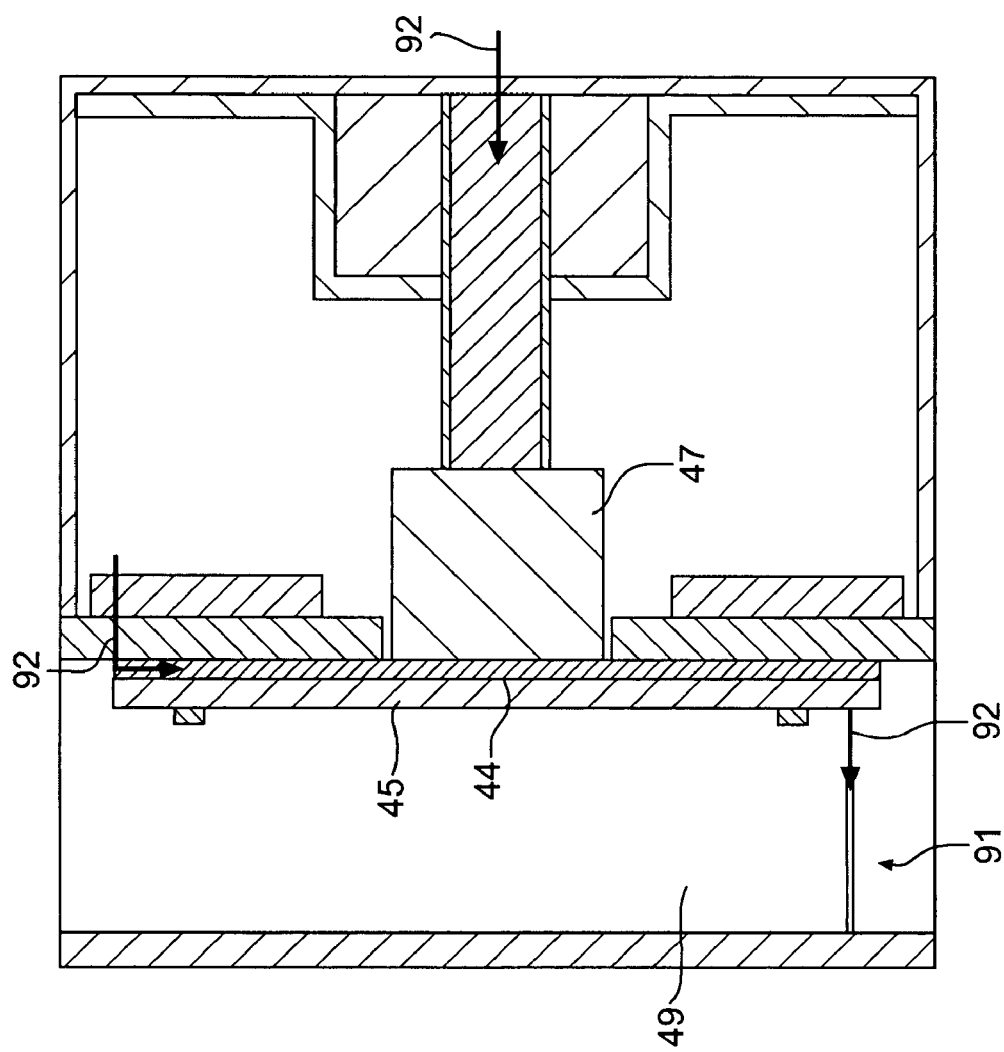
FIG. 6 is a schematic sectional view taken along line 6—6 in FIG. 3.
Figure 7:
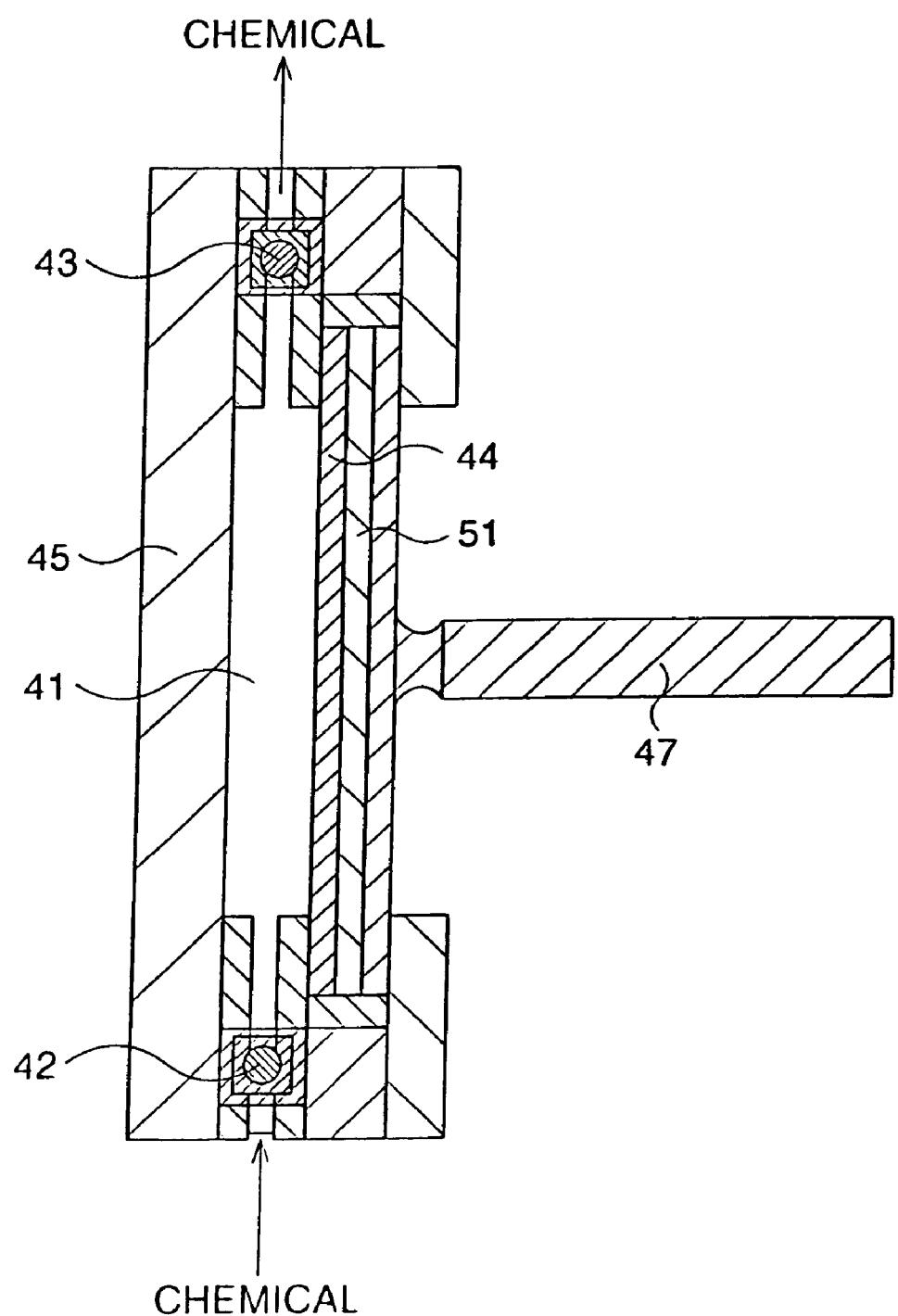
FIG. 7 is a schematic sectional view showing a vicinity of a flow passage of the chemical supply pump that is a component of the chemical supply system.

FIGS. 5 and 6 are typical views showing a concrete example of the corrosion prevention system (sectional views: two directions).

In the chemical supply pump 31, thinkable is a case that the bypass 49 has a portion made of a fluororesin, and a very minute gap is formed between the movable wall 44 and the side wall 45. In the portion with a relatively low anti-corrosion property made of such a resin or the corner portions forming the gap, when a liquid chemical stays, for example, if the liquid chemical is HF, vapor of the liquid chemical is apt to be generated from there, and it may become one cause of bringing about corrosion. So, by providing the corrosion prevention system, corrosion from the liquid chemical or the chemical vapor can be prevented. This corrosion prevention system 91 is constructed by comprising a ventilation system 92 (shown by arrows in FIGS. 5 and 6) for a carrier gas passing through the portion with a relatively low anti-corrosion property and the corner portions, concretely, portions including the periphery of each of the suction valve 42, the above discharge valve 43, and the movable wall 44. By passing $N_2$ gas or the like through this ventilation system 92, without the liquid chemical staying in the portion with a relatively low anti-corrosion property and the corner portions, the liquid chemical passes through only the regulated region of the flow passage 41. Accordingly, corrosion due to the liquid chemical or the chemical vapor can be prevented.

Next, a flow rate regulation system using the flow rate regulation means 34 for regulating the flow rate of ultrapure water passing through the piping system 23, will be described.

As shown in FIG. 1, this flow rate regulation means 34 is provided at a portion corresponding to the downstream of ultrapure water of the connection portion of the capillary 33 of the supply flow passage 23, and regulates the flow rate of ultrapure water or a cleaning liquid by utilizing generation of a so-called Karman vortex. That is, when there is some obstacle in a flow, Karman vortices are generated on the downstream side, and it is known that the generation frequency of these vortices is in proportion to the flow velocity in a wide Reynolds number range without being affected by temperature/pressure or the like, and the flow rate can be measured by detecting the number of these vortices. And, the measurement result of the flow rate regulation means 34 is transmitted to the chemical supply control means 37, and opening and closing of the flow rate control valve of the flow rate regulation means 34 is controlled.

Next, a concentration regulation system using the concentration regulation means 35 for regulating the concentration of a cleaning liquid passing through the piping system 23, will be described.

As shown in FIG. 1, this concentration regulation means 35 is provided at a portion corresponding to the downstream of the cleaning liquid of the connection portion of the capillary 33 of the supply flow passage 23, and constructed by molding two pairs of annular solenoids (excitation transformers T1 and detection transformers T2 through which an alternating current flows) with a resin. By dipping this in the cleaning liquid, a closed circuit that the cleaning liquid intersects each of the two annular solenoids is formed. When a constant alternating current is made to flow in the excitation transformer T1 of one annular solenoid, a constant magnetic field is generated in the core. Because a current flows in the cleaning liquid in accordance with its conductivity, the magnetic field according to the current is generated in the detection transformer T2 of the other annular solenoid, besides, an induced electromotive force is generated in a coil, and this induced electromotive force is in proportion to the conductivity of the cleaning liquid. The conductivity measured in this manner and the cleaning liquid concentration (particularly, HF concentration) have a very high relation, and the cleaning liquid concentration can be obtained with high accuracy from a calibration curve obtained beforehand. And, the measurement result of the concentration regulation means 35 is transmitted to the concentration control means 38, and fed back to the chemical supply control means 37, and the voltage applied to the chemical supply pump 31 is regulated to perform flow rate control of the cleaning liquid.

Next, a chemical mixing system using the mixing means 36 disposed at the connection portion to the capillary 33 of the piping system 23, for producing a rotational flow in a cleaning liquid to stir and uniformize the cleaning liquid, will be described.

FIGS. 22A to 22C and FIGS. 23A and 23B exemplify various forms of this mixing means 36. The mixing means 36 has a cone shape, in which a flowing-in portion 36a to the mixing means 36 in the piping system 23 and a flowing-out portion 36b are provided with being offset slightly. When a liquid chemical is supplied from the capillary 33, a rotational flow in a predetermined rotational direction is produced due to the cone shape of the mixing means 36 and the positional relation between the flowing-in portion 36a and the flowing-out portion 36b. Thereby, the liquid chemical is stirred to be uniform with ultrapure water, and flows in the piping system 23.

Figure 22A:
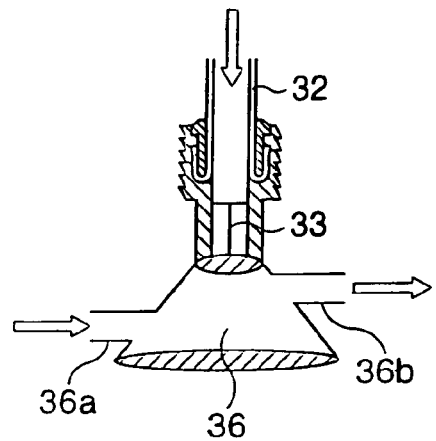
FIGS. 22A to 22C are schematic sectional views showing an example of chemical mixing system.
Figure 22B:
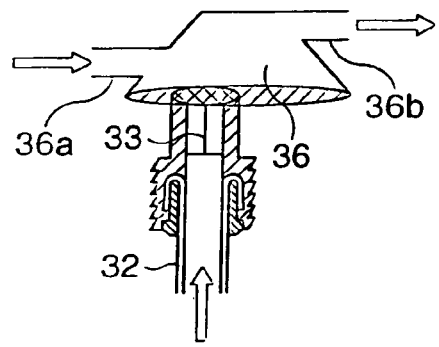
Figure 22C:
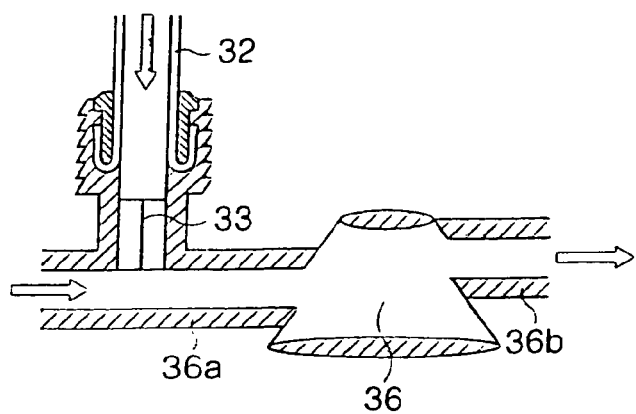
Figure 23A:
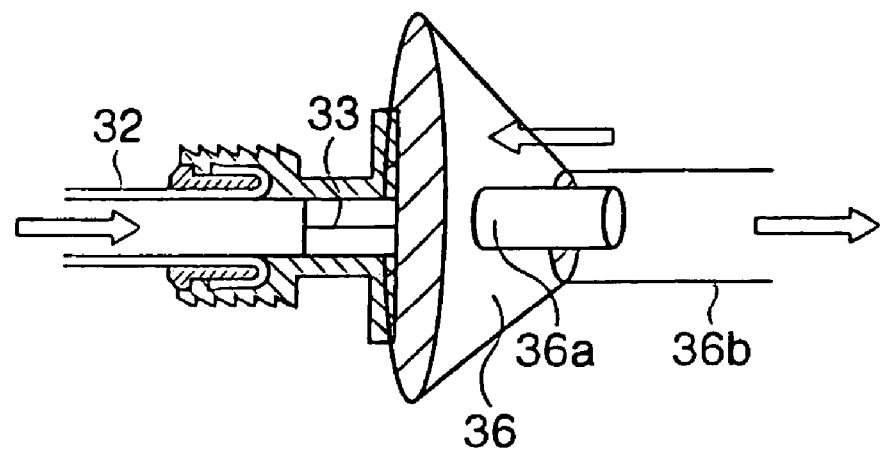
FIGS. 23A and 23B are schematic sectional views showing another example of chemical mixing system.
Figure 23B:
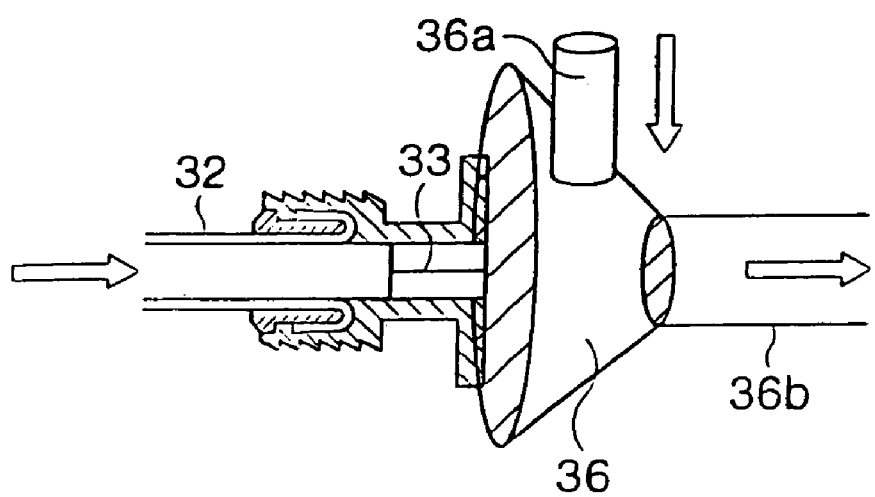

Here, in FIG. 22A, the mixing means 36 of the cone shape is provided so as to be a state that the flow passage expands from the capillary 33, inversely in FIG. 22B, the cone shape is provided so as to be a state that the flow passage contracts. Besides, in FIG. 22C, the capillary 33 and the mixing means 36 are provided so as to be slightly distant. Further, in FIG. 23A, the flowing-in portion 36a and the flowing-out portion 36b are provided so as to be substantially perpendicular, and, in FIG. 23B, the flowing-in portion 36a and the flowing-out portion 36b are provided so as to be inverse in flow direction.

Figure 24A:
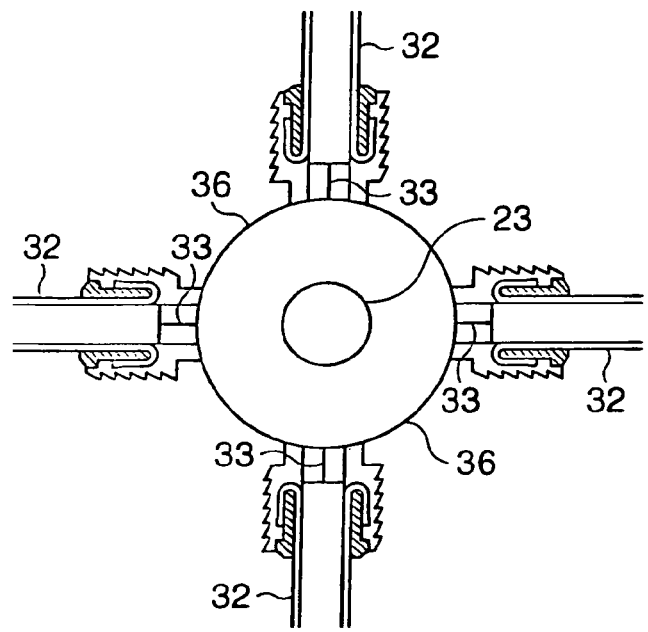
FIGS. 24A and 24B are schematic sectional views showing still another example of chemical mixing system.
Figure 24B:
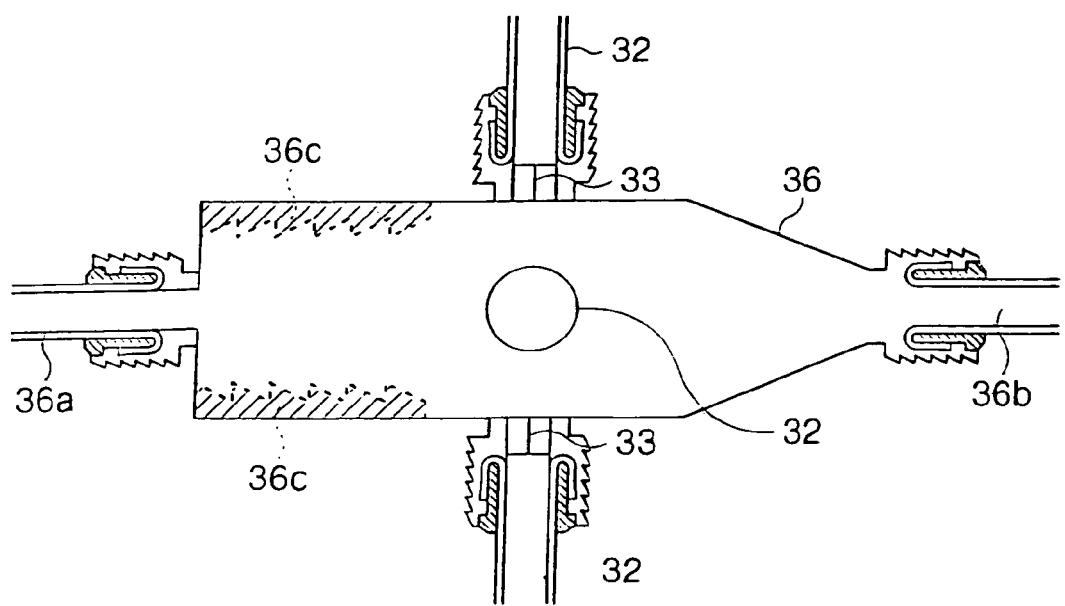

FIGS. 24A and 24B (FIG. 24A is a cross section and FIG. 24B is a vertical section) show another form of the mixing means 36. In this mixing means 36, four connecting tubes 32 and capillaries 33 are connected symmetrically, and it has a tapered shape toward the downstream side of the cleaning liquid. And, a spiral pitch 36c is formed in the flow passage of its inner wall surface, and a rotational flow is produced in the cleaning liquid to stir, by the cleaning liquid passing through the pitch, and uniformizing is intended.

Figure 25A:
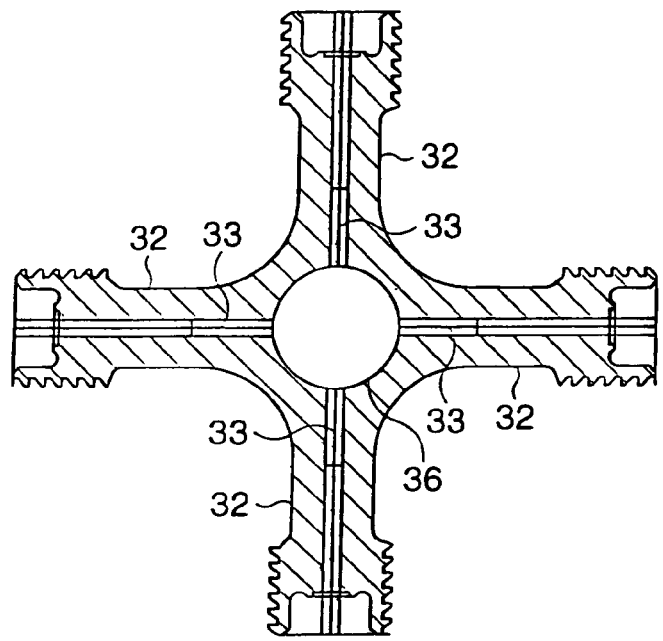
FIGS. 25A and 25B are schematic sectional views showing still another example of chemical mixing system.
Figure 25B:
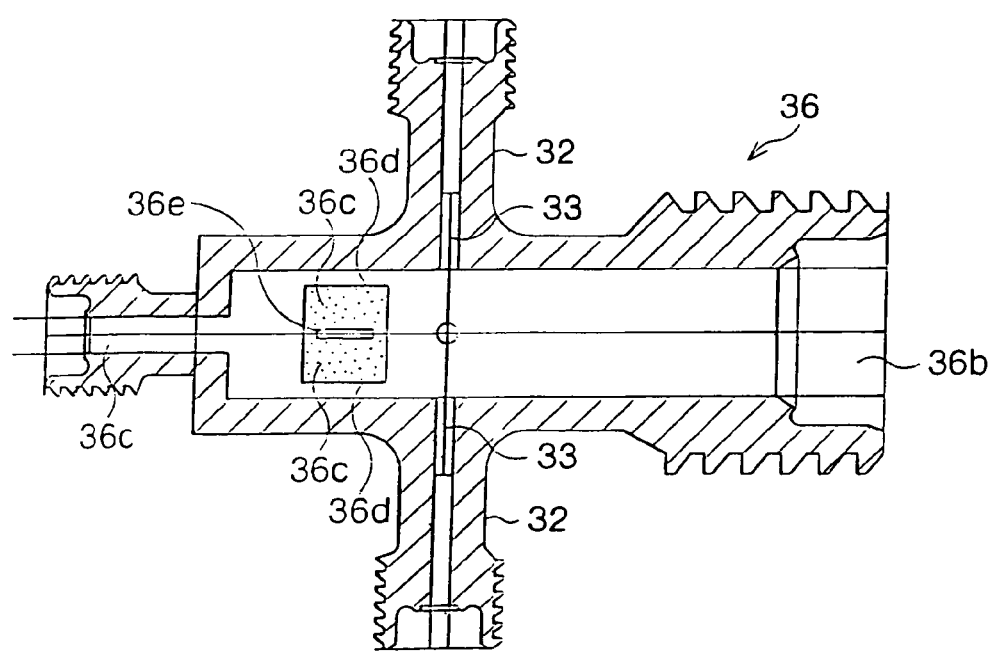

FIGS. 25A and 25B (FIG. 25A is a cross section and FIG. 25B is a vertical section) show still another form of the mixing means 36. In this mixing means 36, four connecting tubes 32 and capillaries 33 are connected symmetrically, a gap 36d along the inner wall surface and a tubule 36e in the central portion form the flow passage for the cleaning liquid, and a spiral pitch 36c is formed in part of the gap 36d.

Figure 26:
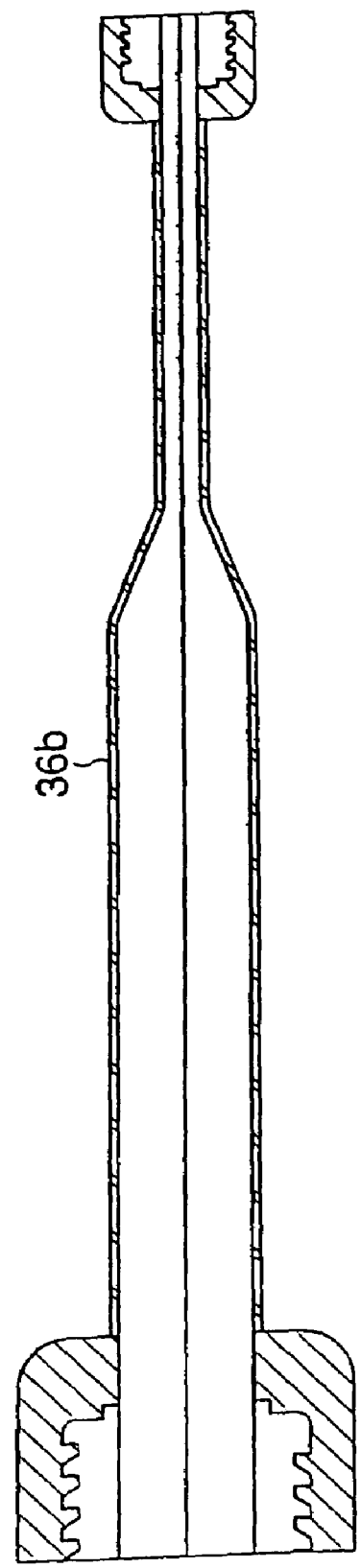
FIG. 26 is a schematic sectional view showing an enlarged tip end portion of the chemical mixing system of FIGS. 25A and 25B.

And, in this mixing means 36, as shown in FIG. 26, the flowing-out portion 36b has a tapered shape toward the downstream side of the cleaning liquid.

In this manner, by the mixing means 36, it becomes possible to suppress generation of concentration unevenness of the liquid chemical apt to occur in the piping system 23, and to supply the cleaning liquid surely uniformized.

Next, a system for regulating the chemical quantity of the chemical storage tank 21 into a predetermined value, will be described.

Figure 27:
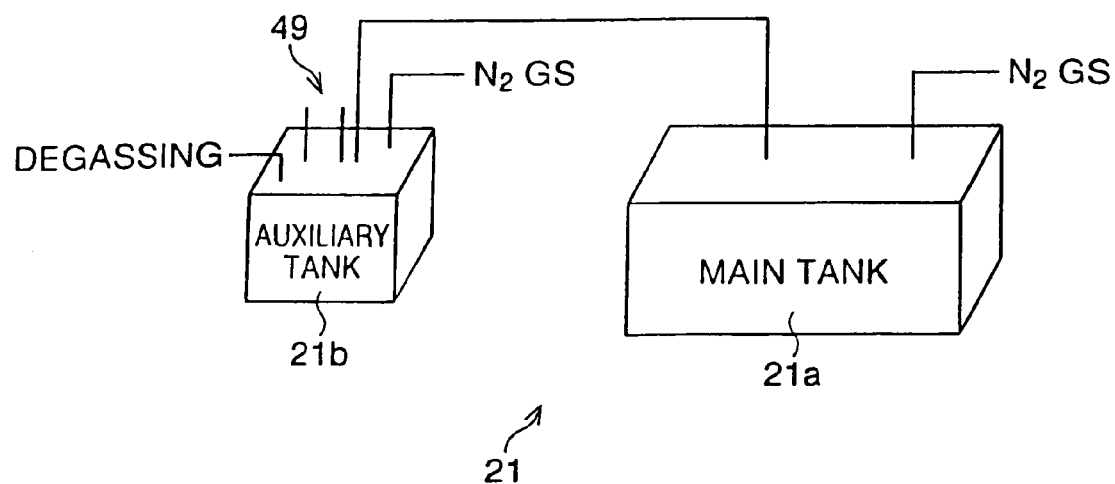
FIG. 27 is a typical view showing a chemical quantity regulation system.

Here, exemplified is a case that a plurality of chemical storage tanks 21 (three in the example shown in the drawing) is provided as the chemical quantity regulation system, as shown in FIG. 14. As shown in FIG. 14, in the chemical storage tanks 21, HF, $H_2O_2$, and a surface active agent are stored in this order as liquid chemicals A, B, and C. As shown in FIG. 27, each chemical storage tank 21 (here, among three, the chemical storage tank 21 in which the liquid chemical A is stored is exemplified as a representative) is constructed by comprising a main tank 21a in which a sufficient quantity of liquid chemical is stored, and an auxiliary tank 21b which is connected to the main tank 21a and only a necessary quantity of liquid chemical is supplied to from the main tank 21a.

Figure 28:
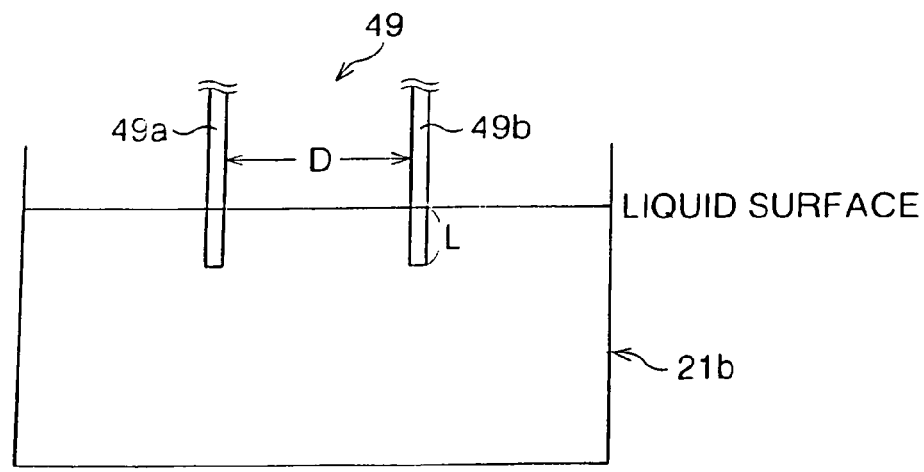
FIG. 28 is a typical view showing a liquid surface regulation means.

In each auxiliary tank 21b, provided is a liquid surface regulation means 49 for regulating the liquid surface level of the supplied liquid chemical by the pressure of $N_2$ gas to control the chemical quantity. As shown in FIG. 28, this liquid surface regulation means 49 has a pair of bar-like sensors 49a and 49b made of, e.g., carbon, and obtains the liquid surface level by measuring the electrostatic capacity of the liquid chemical between the bar-like sensors 49a and 49b as described below.

Figure 29:
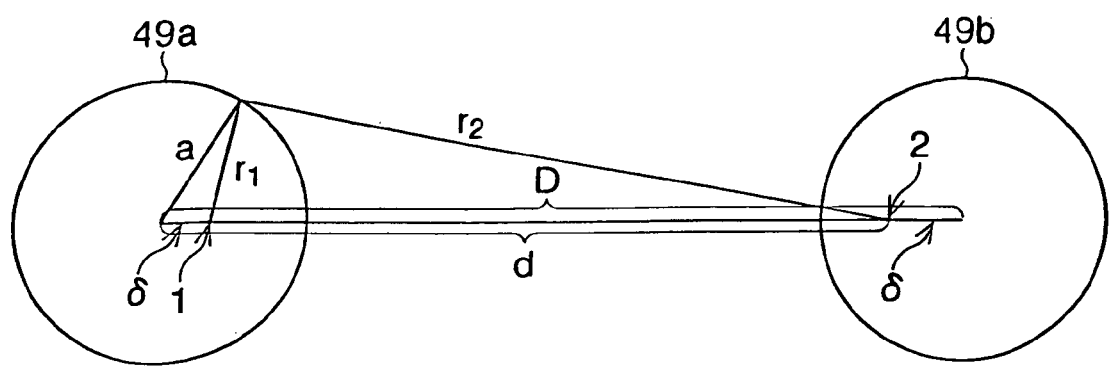
FIG. 29 is a typical view for illustrating the operation principle of the liquid surface regulation means.

Here, the principle of the liquid surface level measurement by the liquid surface regulation means 49, will be described. The distance from the liquid surface of the liquid chemical to the lower end of the bar-like sensor is L, the interval between the bar-like sensors is D, and r1, r2, a, d, and δ are defined as shown in FIG. 29. In this case, since $$\delta/a = a/d = r1/r2$$

is given, if there are the charge of +Q on the circle 1 (cross section of one bar-like sensor) and the charge of −Q on the circle 2 (cross section of the other bar-like sensor), in relation to all points of one bar-like sensor, $$(Q/L)2\pi\varepsilon_o(\ln(r1) - \ln(r2)) = (Q/L)2\pi\varepsilon_0\ln(r1/r2) = (Q/L)2\pi\varepsilon_0\ln(a/d)$$

is given. Since the charge Q distributing on the straight line 1-2 makes the same electric field outside the bar-like sensor as that in case that the same amount of charge is present on the surface of the bar-like sensor, the potential difference between two bar-like sensors is equal to $$(Q/L)\pi\varepsilon_0\ln(a/d),$$

and the capacitance C is given by $$C=\pi\varepsilon_0L/\ln(a/d) \qquad (1).$$

Substituting $a/d=\exp(\pi\varepsilon_0L/C)$ for the expression (1), $$D/a = \exp(\pi\varepsilon_0L/C) + \exp(-\pi\varepsilon_0L/C)$$
$$= 2\cosh(\pi\varepsilon_0L/C)$$

is given, and $$C=\pi\varepsilon_0L/(\cosh^{-1}D/2a) \qquad (2)$$

is given. From this expression (2), by measuring the value of C, the value of L can be obtained.

In this manner, according to the liquid surface regulation means 49, by measuring the electric capacity of dipped portions of the bar-like sensors 49a and 49b in the liquid chemical and its change over time, the liquid surface level and its changing speed can be calculated. That is, by using the liquid surface level as a parameter, for example, the deviation from the liquid surface level expected value is measured and regulation to the expected value can be made. By using the changing speed of the liquid surface level as a parameter, by measuring the increase of the above changing speed, an accident caused by it, for example, leakage of the main tank 21a can be checked. Accordingly, by this liquid surface regulation means 49, it becomes possible efficiently and surely to measure the liquid surface level of a liquid chemical and its changing speed, and chemical supply at need, sure detection of generation of various troubles attendant upon chemical supply, etc., can be realized.

Figure 30:
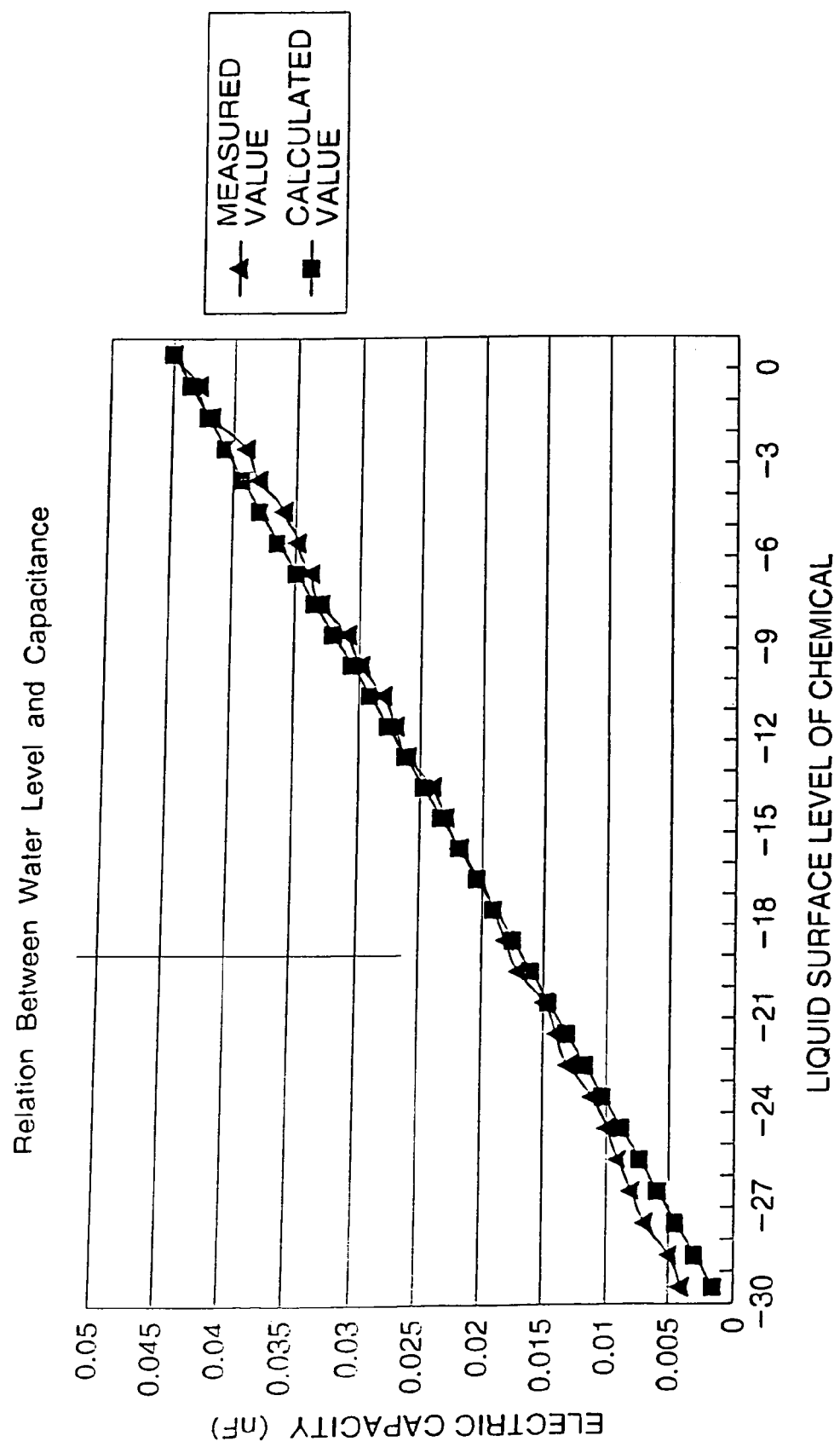
FIG. 30 is a characteristic graph showing a relation between the liquid surface level of a cleaning liquid and capacity.

Actually, FIG. 30 shows the results that the relation between the liquid surface level of a liquid-chemical and the capacitance is examined. This FIG. 30 shows the relation between calculated values with the expression (2) and measured values. Here, the measured values were measured under the conditions of $\varepsilon_0=7.17\times10^{-10}$ F/m, the radius of the bar-like sensor=2 mm, the interval=10 mm, and the length of the bar-like sensor=31.0 mm, and the calculated values were calculated using the same conditions. In this characteristic graph, the axis of abscissas gives the liquid surface level of the liquid chemical (0 mm at full), and the axis of ordinates gives the capacitance (nF). In this manner, the calculated values and the measured values are almost equal, and it is found that C and L have a proportional relation.

Next, a system for defoaming as maintenance of the chemical supply system, will be described.

As shown in FIG. 1, this defoaming system 101 has a connecting tube 102 provided so as to branch from a portion corresponding to the upstream of ultrapure water of the connection portion to the capillary 33 of the supply flow passage 23, and the connecting tube 102 is connected to the chemical supply pump 31 to form a closed system. And, when the chemical storage tank 21 is unused, a valve 103 is opened, the chemical supply pump 31 is driven, and ultrapure water is made to flow in the closed system to defoam.

Thereby, the chemical supply pump 31, the capillary 33, etc., are efficiently cleaned, and defoaming is surely performed.

Next, a dissolved gas removal system for suppressing bubbling of dissolved gas in a liquid chemical in discharging, in order to aim at further improvement of the chemical discharge accuracy of the chemical supply pump 31, will be described.

The chemical supply pump 31 is a diaphragm pump repeatedly performing discharge/suction of a liquid chemical periodically by oscillation drive of the movable wall 44 by the piezoelectric oscillator 46 that is a shaker as described above. In oscillation drive, if dissolved gas bubbles in the liquid chemical, remarkable deterioration is brought on the flow rate characteristic of the liquid chemical, and, in the worst case, it is apprehended that gas lock occurs and the discharged flow rate becomes zero. Because high-degree accuracy is required for the discharge quantity and the discharge speed of the liquid chemical, the affection of bubbling of dissolved gas on the discharged flow rate is a very important problem.

The present inventors have perceived that bubbling of dissolved gas greatly depends on mechanical characteristics of the chemical supply pump 31 and physical characteristics (relative temperature/pressure) of the liquid chemical, and thought that bubbling of dissolved gas in the liquid chemical is suppressed by controlling them. Hereinafter, dissolved gas removal systems for making those controls will be described in order.

Figure 31A:
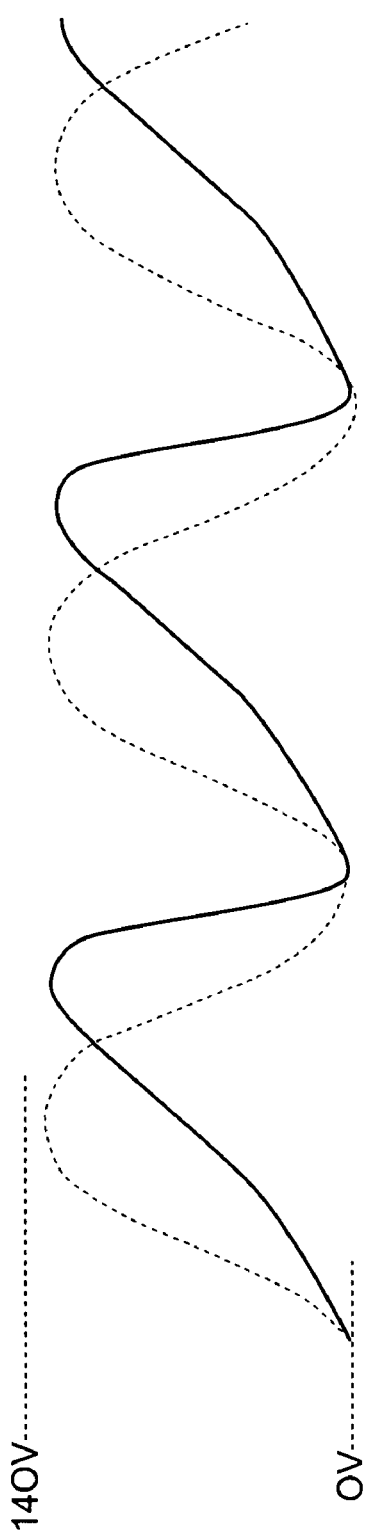
FIGS. 31A and 31B are characteristic graphs showing oscillation states of discharge/suck by a chemical supply pump.

(1) Control of a mechanical characteristic (oscillation manner) of the chemical supply pump 31:

Normally, the oscillation manner (voltage application manner) of the movable wall 44 by the piezoelectric oscillator 46 has an oscillation wave form that draws a typical sine curve with substantially the same period, as shown by a broken line in FIG. 31A. In this case, the probability of dissolved gas bubbling in a liquid chemical is high when a pressure less than the atmospheric pressure (negative pressure) is applied to the liquid chemical. So, in this example, by controlling such that the absolute value of the negative pressure when the liquid chemical is sucked, is as small as possible, and the suction time is longer than the discharge time, bubbling of dissolved gas is suppressed as few as possible.

Figure 31B:
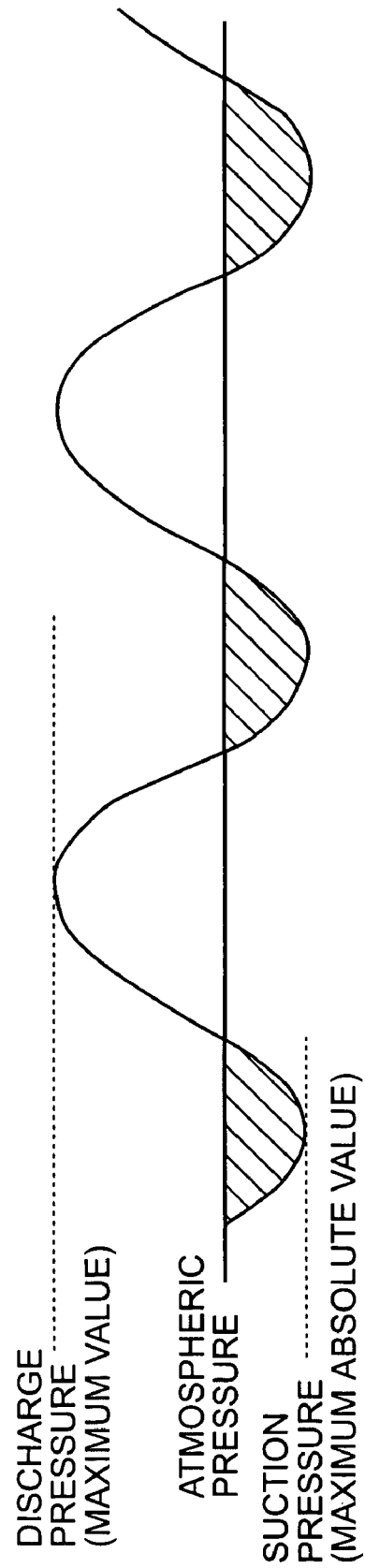

Concretely, as shown by a solid line in FIG. 31A, in one period, the rate of change of pressure at the time of suction that a negative pressure is produced, is suppressed to be gentle in comparison with that at the time of discharge that a positive pressure is produced. Together with this, as shown by the pressure application manner of FIG. 31B, the absolute value of the negative pressure in suction is made smaller than the positive pressure in discharge, and this absolute value of the negative pressure is made as small as possible. That is, the impulse (the absolute value thereof) due to the negative pressure shown by the area with slanting lines in FIG. 31B is made smaller than the impulse due to the positive pressure, and as small as possible unless the function as the chemical supply pump is detracted. By the former (FIG. 31A), bubbling due to rapid pressure change at the time of suction is prevented, and, by the latter (FIG. 31B), the load on the liquid chemical due to the negative pressure is relieved to prevent bubbling. That is, by control standing on both of these, it becomes possible to suppress bubbling of dissolved gas in the liquid chemical as minimum as possible.

Figure 32:
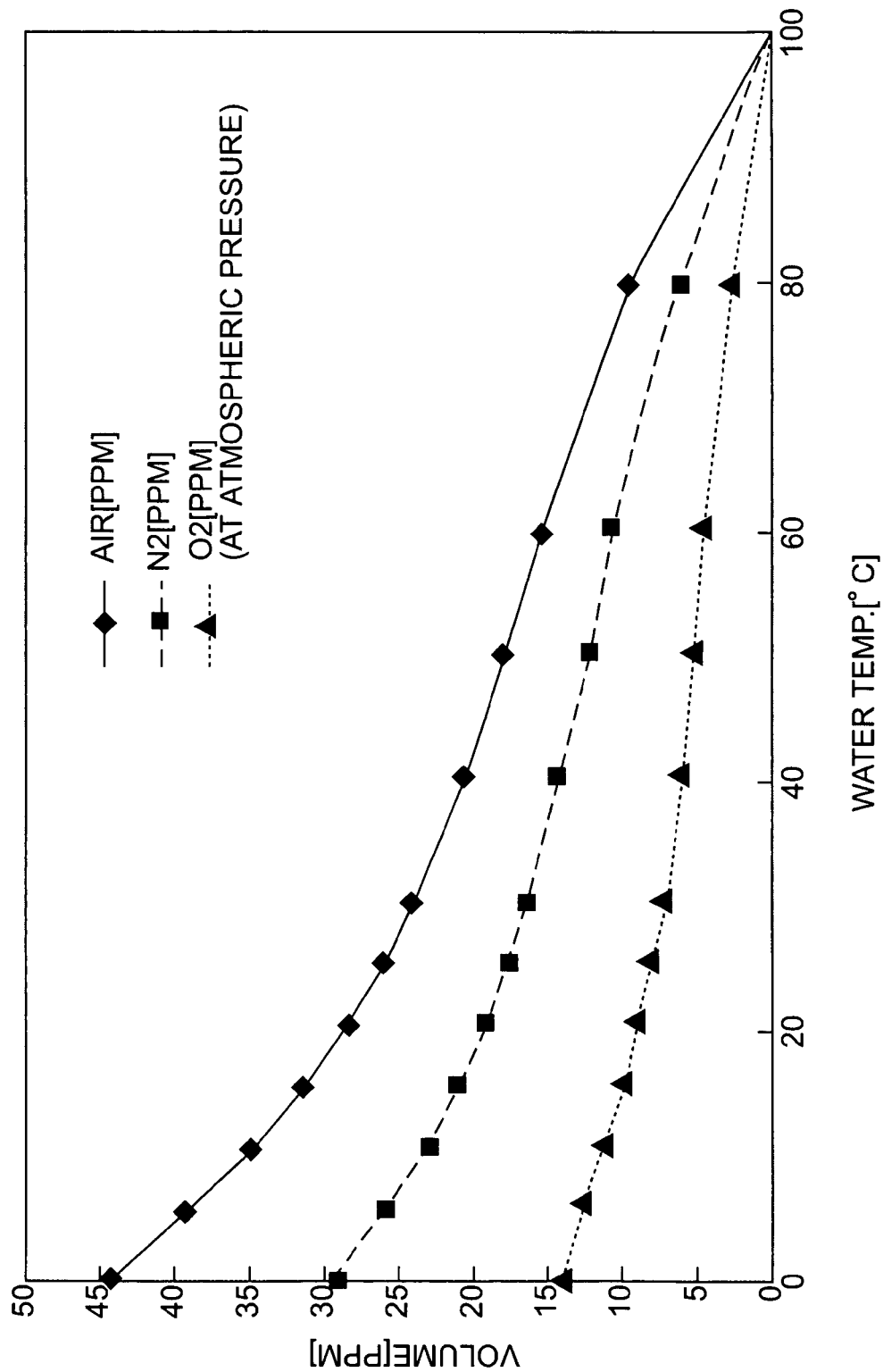
FIG. 32 is a characteristic graph showing relations between temperature and quantity of dissolved air in water, nitrogen, and oxygen thinkable as dissolved gas.

(2) Relative temperature control of liquid chemical:

Dissolution of gas into liquid chemical is in inverse proportion to temperature (Henry's law). This inverse proportion relation can be seen evenly in relation to air, nitrogen, and oxygen thinkable as dissolved gas, as shown in FIG. 32. Accordingly, if the relative temperature to the outside of the chemical supply pump 31 is decreased, the solubility of dissolved gas in the liquid chemical in the flow passage 41 of the chemical supply pump 31 becomes great to suppress bubbling. So, in this example, a cooling means is provided to cool the chemical supply pump 31 (and the piping portion connecting between the chemical tank 21 and the chemical supply pump 31).

Figure 33:
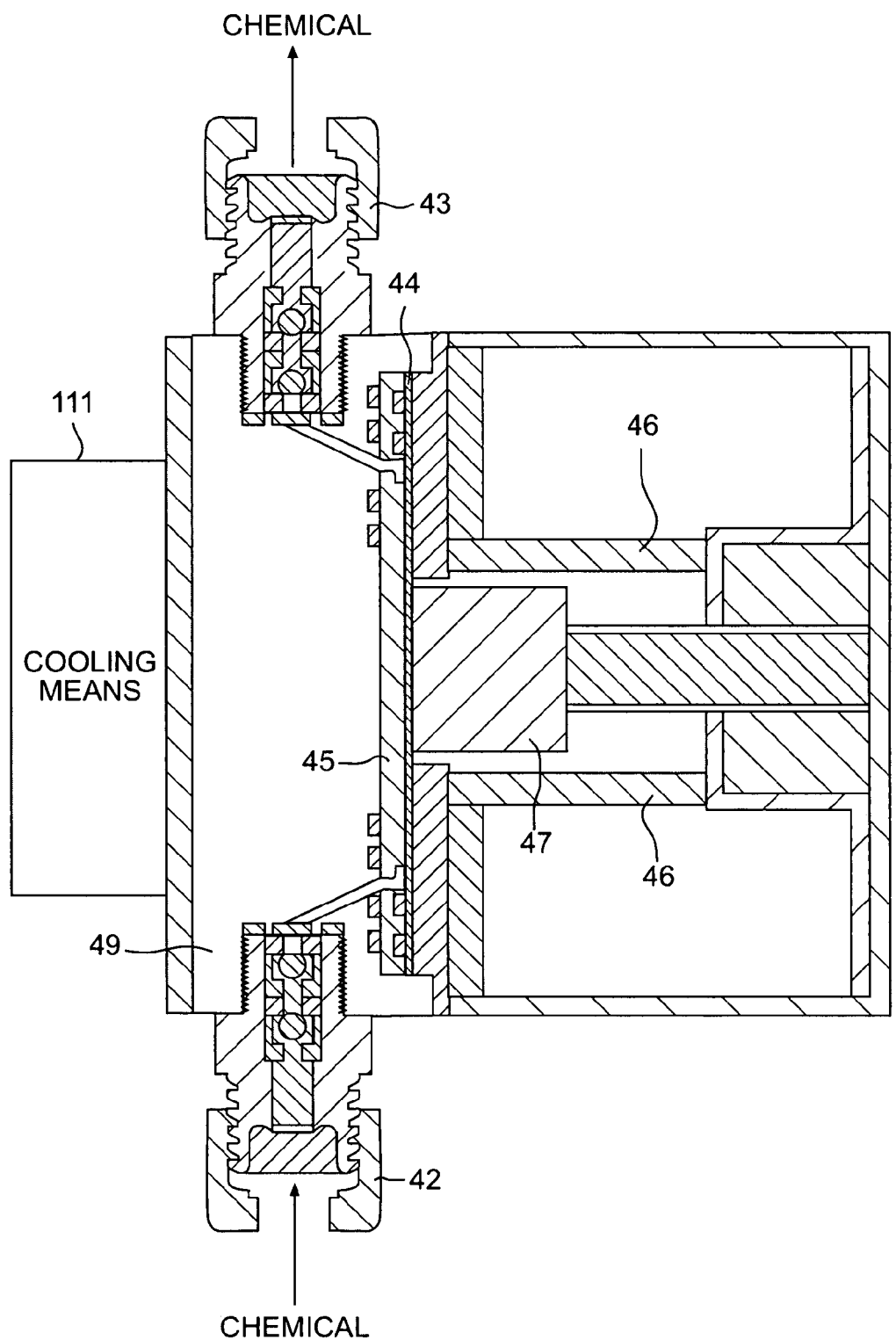
FIG. 33 is a schematic sectional view showing a state that a cooling means is provided in a chemical supply pump.

Concretely, as shown in FIG. 33, a cooling means 111 is provided on the chemical supply pump 31. As this cooling means 111, suitable is one including a Peltier element as the principal component, one in which a cooling liquid is circulated on the periphery of the chemical supply pump 31, or the like. By providing such a cooling means 111 and cooling the chemical supply pump 31 to a predetermined temperature, it becomes possible to suppress bubbling of dissolved gas in the liquid chemical as minimum as possible.

(3) Degassing of liquid chemical:

If dissolved gas is degassed from a liquid chemical before the liquid chemical is sucked in the chemical supply pump 31, bubbling in suction/discharge of the chemical supply pump 31 is prevented. So, in this example, a degassing module comprising a diaphragm tube whose surface layer is a degassing film, is provided between the chemical tank 21 and the chemical supply pump 31.

Figure 34A:
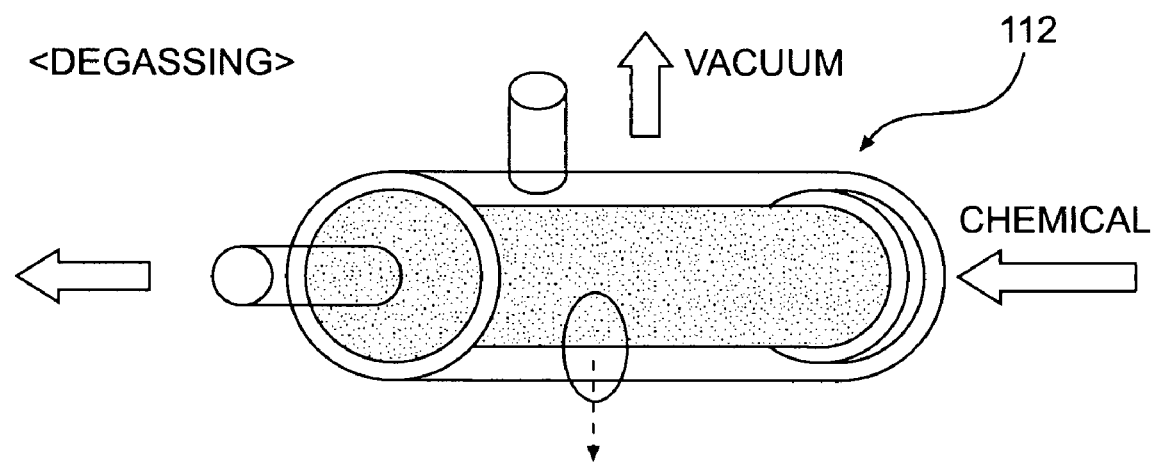
FIGS. 34A and 34B are typical views showing a membranous tube that is a component of a degassing module.
Figure 34B:
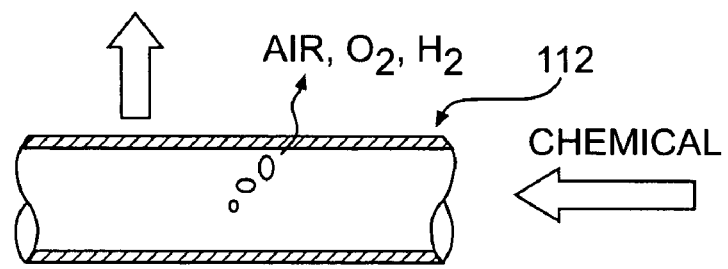

FIGS. 34A and 34B are typical views showing a diaphragm tube that is a component of a degassing module. Here, it is suitable to construct the diaphragm tube 112 by a porous film or a hollow film whose material is PTFE (polytetrafluoroethylene) or the like.

As shown in FIGS. 34A and 34B, by making the outside of the diaphragm tube 112 in a high-degree vacuum state, degassing is performed using the pressure difference between the inside of the tube and the outside. By using this degassing module, it becomes possible to suppress bubbling of dissolved gas (air, oxygen, or nitrogen in the example shown in the drawing) in the liquid chemical as minimum as possible.

As the dissolved gas removal system, not only (1) to (3) are used individually, but also they are executed in proper combination to aim at further sure bubbling suppression.

Among various additional systems described above, together with control of the chemical supply pump 31, at least the mixing prevention system, the bubble/damage detection system, the cleaning liquid flow detection system, the flow rate regulation system, the concentration regulation system, the chemical mixing system, the chemical quantity regulation system, the dissolved gas removal system, etc., are driven by the respective control means of the control system 26.

SECOND EXAMPLE

Successively, the second example of the present invention will be described. In this example, like the first example, a substrate cleaning apparatus of single wafer spin cleaning type comprising a cleaning chamber and a chemical supply system, is disclosed, but it differs on the point that the construction of the chemical supply apparatus of the chemical supply system is different. The same components or the like as those of the substrate cleaning apparatus of the first example are denoted by the same references, and their explanations will be omitted.

Figure 35:
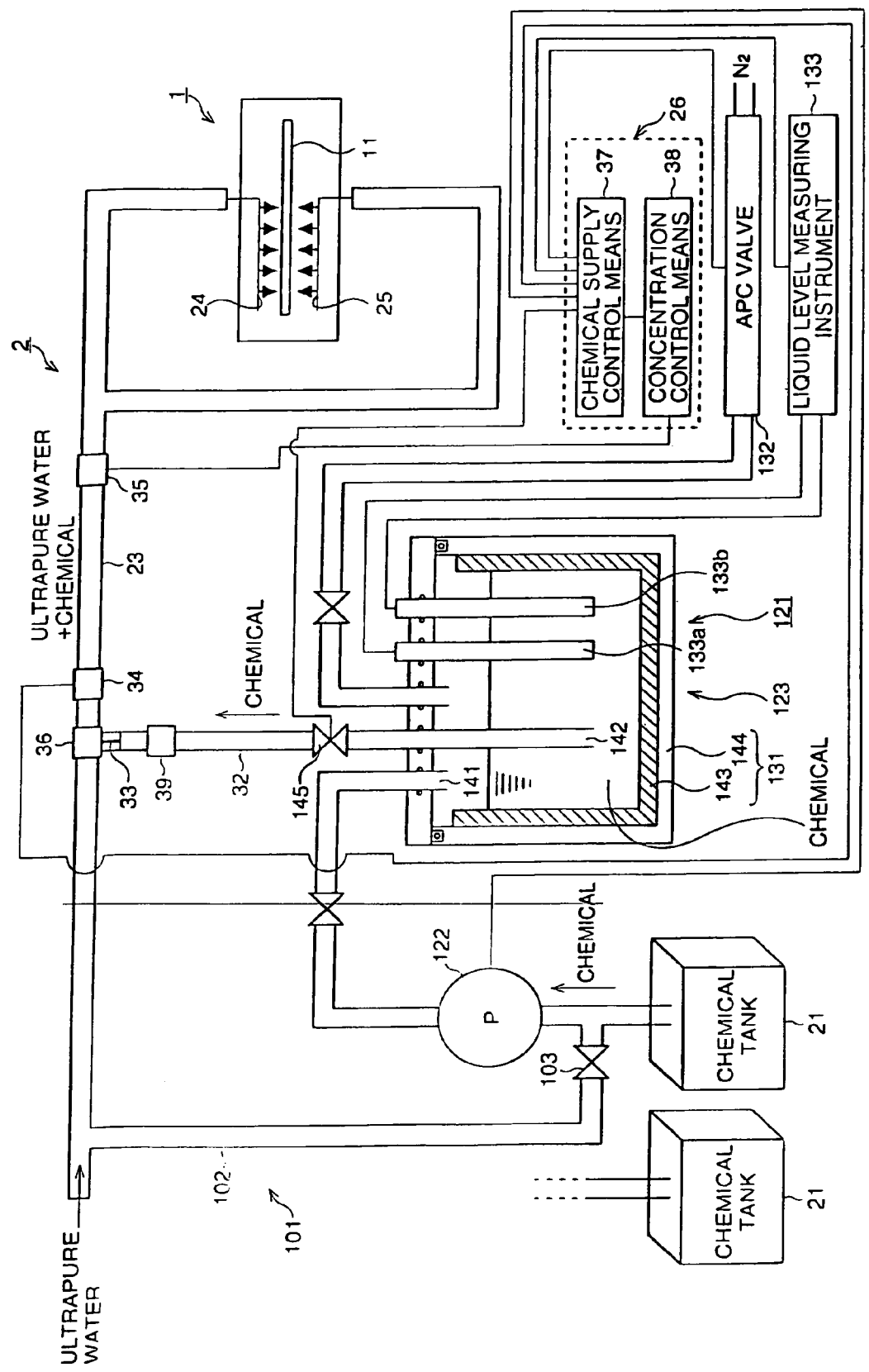
FIG. 35 is a schematic sectional view showing the whole construction of a substrate cleaning apparatus of the second example.

FIG. 35 is a schematic sectional view showing the whole construction of the substrate cleaning apparatus of this example.

The substrate cleaning apparatus of this example is constructed by comprising a cleaning chamber 1 and a chemical supply system 2. Here, the chemical supply system 2 is constructed by comprising a chemical storage tank 21, a chemical supply apparatus 121 connected to the chemical storage tank 21 for positively performing chemical supply, a piping system 23 connected to the chemical supply apparatus 121 to form a supply flow passage that is a passage for ultrapure water with which a liquid chemical is mixed, a pair of discharge nozzles 24 and 25 for supplying a cleaning liquid to the surfaces of a wafer 11 set in the cleaning chamber 1, and a control system 26 for regulating various conditions such as the concentration and the flow rate of the cleaning liquid supplied from the discharge nozzles 24 and 25.

The chemical supply apparatus 121 is constructed by comprising a first pump 122 for sucking a liquid chemical from the chemical storage tank 21 to feed out, a second pump 123 of force feed type for storing the liquid chemical fed out from the first pump 122, applying a predetermined pressure to the liquid chemical, and supplying a predetermined quantity of liquid chemical by controlling opening and closing of a valve 145, a connecting tube 32 connecting the piping system 23 and the second pump 123 to form a connecting flow passage, and a capillary 33 directly connecting to the supply flow passage of the piping system 23 in the connecting tube 32.

The first pump 122 may be a diaphragm pump like the chemical supply pump 31 or a pump of another construction if the predetermined quantity of liquid chemical is accurately supplied from the chemical storage tank 21 to the second pump 123.

The second pump 123 is a pump of force feed type, and is constructed by comprising a pressurized vessel 131 that is a chemical storage means in which the liquid chemical supplied from the first pump 122 is stored, a pressure control means 132 for making pressure control by feeding, e.g., $N_2$ gas into the liquid chemical in the chemical storage means 131, and a liquid level measurement means 133 for measuring change in liquid quantity of the liquid chemical in the pressurized vessel 131.

The pressurized vessel 131 is made of PTFE at the inner wall 143 and a metal at the outer wall 144, and a flowing-in port 141 to which the liquid chemical from the first pump 122 is supplied, and a flowing-out port 142 to discharge the liquid chemical toward the connecting tube 32, are connected.

The pressure control means 132 has an auto pressure control (APC) valve automatically controlling the pressure to the liquid chemical in the pressurized vessel 131, and automatically controls the supply quantity of, e.g., $N_2$ gas into the pressurized vessel 131 on the basis of a control signal from the control system 26.

The liquid level measurement means 133 has a pair of bar-like sensors 133a and 133b made of conductive members of, e.g., carbon or the like, and obtains the liquid surface level (and the change quantity thereof) by measuring the electrostatic capacity of the liquid chemical between the bar-like sensors 133a and 133b. The measurement principle of the liquid level measurement means 133 is the same as the case using the bar-like sensors 49a and 49b of the liquid surface regulation means 49 described above, and, by measuring the electrostatic capacity of the dipped portions of the bar-like sensors 133a and 133b in the liquid chemical and its change over time, the liquid surface level and the changing speed thereof are calculated. The result measured by this liquid level measurement means 133 is fed back to the control system 26, and, on the basis of this, a predetermined control signal is sent out to the pressure control means 132.

Here, the operation principle of the second pump 123 will be described.

When the pressure control means 132 receives the control signal, a predetermined quantity of $N_2$ gas is fed into the pressurized vessel 131, and thereby a pressure $P_1$ is applied to the liquid chemical in the pressurized vessel 131. At this time, when the pressure of ultrapure water passing through the piping system 23 is $P_0$, a predetermined quantity of liquid chemical is discharged from the flowing-out port 142 due to the pressure difference $(P_1-P_0)$. When the flow rate of the liquid chemical in the capillary 33 is Q, the flow rate Q is expressed with the pressure difference $(P_1-P_0)$ and a coefficient k depending on the shape of the capillary 33 into:

$$Q \propto k(P_1-P_0)^{1/2} \quad (3).$$

For example, when the pressure $P_0$ is 1.5 kg/cm$^2$ and the pressure $P_1$ is 3.0 kg/cm$^2$, the flow rate Q corresponding to the pressure difference $(P_1-P_0)$ is determined by the expression (3).

The control system 26 comprises a chemical supply control means 37 for regulating the supply quantity of the liquid chemical from the chemical storage tank 21 to the pressurized vessel 131 by the first pump 122, regulating the supply quantity of the liquid chemical to ultrapure water by the second pump 123, and further driving a flow rate regulation means 34, and a concentration control means 38 for driving a concentration regulation means 35.

Here, the chemical supply control means 37 controls the opening and closing timing of the valve 145 in addition to the pressure control means 132 and the liquid level measurement means 133 as described above when it controls drive of the second pump 123, and regulates the discharge time of the liquid chemical to the connecting tube 32 and stop of discharge.

And, in the control system 26, the chemical supply control means 37 and the concentration control means 38 are connected, the result of concentration control by the concentration control means 38 is fed back to the chemical supply control means 37 to control the first and second pumps 122 and 123, and the supply quantity of the liquid chemical is regulated.

Also in the substrate cleaning apparatus of this example, like the case of the first example, in order to ensure the further suppression of particle generation or the like and the accuracy of the chemical concentration of the cleaning liquid, various additional systems are provided to the chemical supply system constructed as described above. Concretely, like the first example, listed are a mixing prevention system, a bubble/damage detection system, a cleaning liquid flow detection system, a corrosion prevention system, a flow rate regulation system, a concentration regulation system, a chemical mixing system, a chemical quantity regulation system, a defoaming system, a dissolved gas removal system, etc. Control of these additional systems is also made by the control system 26.

In this manner, in the substrate cleaning apparatus of this example, by the first and second pumps 122 and 123, the liquid chemical is discharged by drive control of the pressure control means 132, and it becomes possible to discharge and supply a desired quantity of liquid chemical with accuracy.

Further in this example, provided is the chemical supply apparatus 121 including these first and second pumps 122 and 123 as components. This chemical supply apparatus 121 mixes the liquid chemical from the capillary 33 with ultrapure water passing through the piping system 23 by drive of the first and second pumps 122 and 123, and mixture solutions (cleaning liquids) at various concentrations can easily be compounded at need. Here, in case that the discharge direction of the liquid chemical is a direction substantially perpendicular to the flow direction of ultrapure water, by applying a pressure to the liquid chemical such that the linear velocity of the liquid chemical discharged from the tubule member is sufficiently larger than the linear velocity of ultrapure water passing through the piping system 23, the liquid chemical reaches the opposite wall surface of the piping system 23 in ultrapure water, and a mixture solution at a uniform concentration is compounded in a moment.

Further in this example, provided is the chemical supply system 2 including the chemical supply apparatus 121 as a component and for supplying a cleaning liquid. In this chemical supply system 2, because it is possible to produce cleaning liquids at desired concentrations at need as described above, enough is the easily movable small-sized reservoir 21 of the liquid chemical that is the formulated concentrate. That is, in this chemical supply system 2, there is no necessity of providing very large reservoirs for mixture solutions different in chemical concentration and kind as conventionally, and not only particle mixing to a cleaning liquid, or the like, can be suppressed, but also remarkable reduction/simplification of the scale of the whole system can be realized. Accordingly, in the substrate cleaning apparatus of this example provided with this chemical supply system 2, it becomes possible rapidly and easily to supply various pure cleaning liquids different in concentration and kind.

The present invention is not limited to these examples. For example, the chemical supply system is applicable to not only the substrate cleaning apparatus but also any other apparatus in which large quantities of liquid chemicals of various kinds and concentrations are necessary.

What is claimed is:

1. A substrate cleaning apparatus comprising:
   a chemical treatment chamber in which a substrate is cleaned with a mixture solution; and
   a chemical supply system for supplying said mixture solution to said chemical treatment chamber, wherein said mixture solution includes a liquid chemical mixed and diluted with a solvent, and said chemical supply system includes:
      at least one chemical reservoir that is easy to carry, in which said liquid chemical is stored at a high concentration;
      a piping system in which said solvent flows, wherein said piping system includes a discharge portion for said mixture solution at an end thereof;
      a chemical supplier feeding out a predetermined quantity of said liquid chemical from said chemical reservoir into a connecting pipe; and
      a chemical discharger connecting said connecting pipe to said piping system and arranged to discharge said liquid chemical from said connecting pipe into said solvent in the piping system at a linear velocity that is significantly greater than a linear velocity of said solvent to produce said mixture solution at a desired uniform concentration.

* * * * *